United States Patent
Yoshikawa et al.

(10) Patent No.: US 11,468,213 B2
(45) Date of Patent: Oct. 11, 2022

(54) ANTENNA DESIGN SUPPORT APPARATUS, ANTENNA DESIGN SUPPORT METHOD, AND STORAGE MEDIUM

(71) Applicant: FUJITSU LIMITED, Kawasaki (JP)

(72) Inventors: Manabu Yoshikawa, Yokohama (JP); Yohei Koga, Yamato (JP)

(73) Assignee: FUJITSU LIMITED, Kawasaki (JP)

( * ) Notice: Subject to any disclaimer, the term of this patent is extended or adjusted under 35 U.S.C. 154(b) by 182 days.

(21) Appl. No.: 16/783,963

(22) Filed: Feb. 6, 2020

(65) Prior Publication Data

US 2020/0272771 A1 Aug. 27, 2020

(30) Foreign Application Priority Data

Feb. 26, 2019 (JP) ............... JP2019-032740

(51) Int. Cl.
*G06F 30/17* (2020.01)
*G06F 30/12* (2020.01)

(52) U.S. Cl.
CPC .............. *G06F 30/17* (2020.01); *G06F 30/12* (2020.01)

(58) Field of Classification Search
CPC .......... G06F 30/00; G06F 30/17; G06F 30/12; G06F 30/373; G06F 30/39; G06F 30/367
USPC ............................................................ 703/1
See application file for complete search history.

(56) References Cited

U.S. PATENT DOCUMENTS

| 2013/0044038 A1* | 2/2013 | Packer | ............... H01Q 5/50 343/822 |
| 2017/0235869 A1* | 8/2017 | Koga | ............... H01Q 9/42 343/893 |

FOREIGN PATENT DOCUMENTS

| JP | 2017142720 A | * | 8/2017 | ............. H01Q 13/02 |
| JP | 2017142731 A | * | 8/2017 | |

* cited by examiner

*Primary Examiner* — Cedric Johnson
(74) *Attorney, Agent, or Firm* — ArentFox Schiff LLP

(57) ABSTRACT

An apparatus includes circuitry configured to calculate first parameters for determining a structure of a first antenna device based on a specification value set for the first antenna device to be a target of performance evaluation, acquire a communication frequency based on first parameters, calculate an allowable range of deviation of the communication frequency satisfying a specified performance evaluation standard of the first antenna device, determine a structure of a second antenna device as a reference model, and obtain a change amount corresponding to change in the communication frequency in the allowable range of two second parameters having a correlation with each other, and acquire a relational expression of two first parameters of first parameters that correspond to the two second parameters and that have a correlation with each other, and two first parameters based on the change amount and that have the correlation with each other.

9 Claims, 20 Drawing Sheets

FIG. 7

| RESONANCE FREQUENCY (GHz) | Hr,Lr | GNDxr,GNDyr | $\varepsilon$ rr,tr |
|---|---|---|---|
| 2.3 | $Lr_{2.3}$=f(Hr) | $GNDyr_{2.3}$=f(GNDxr) | $tr_{2.3}$=f($\varepsilon$ rr) |
| 2.4 | $Lr_{2.4}$=f(Hr) | $GNDyr_{2.4}$=f(GNDxr) | $tr_{2.4}$=f($\varepsilon$ rr) |
| 2.5 | $Lr_{2.5}$=f(Hr) | $GNDyr_{2.5}$=f(GNDxr) | $tr_{2.5}$=f($\varepsilon$ rr) |
| 2.6 | $Lr_{2.6}$=f(Hr) | $GNDyr_{2.6}$=f(GNDxr) | $tr_{2.6}$=f($\varepsilon$ rr) |
| 2.7 | $Lr_{2.7}$=f(Hr) | $GNDyr_{2.7}$=f(GNDxr) | $tr_{2.7}$=f($\varepsilon$ rr) |

ANTENNA DESIGN SUPPORT APPARATUS, ANTENNA DESIGN SUPPORT METHOD, AND STORAGE MEDIUM

CROSS-REFERENCE TO RELATED APPLICATION

This application is based upon and claims the benefit of priority of the prior Japanese Patent Application No. 2019-32740, filed on Feb. 26, 2019, the entire contents of which are incorporated herein by reference.

FIELD

The embodiment discussed herein is related to an antenna design support apparatus, an antenna design support program, and an antenna design support method.

BACKGROUND

There is an antenna design computer program that acquires a structural parameter that defines the structure of a target antenna and a target characteristic value when the value of the structural parameter is a specified value, and estimates the relationship between the value of the structural parameter and the characteristics of the target antenna based on the relationship between the structural parameter and the target characteristic value, and the structural parameter value and characteristic of a reference antenna having the same shape characteristics but different type as the target antenna.

The antenna design computer program, based on the relationship between the value of the structural parameter and the characteristic of the estimated target antenna, determines the value of the structural parameter so that the characteristic of the target antenna satisfies the required specifications.

For example, related art is disclosed in Japanese Laid-open Patent Publication No. 2017-142720, and the like.

SUMMARY

According to an aspect of the embodiments, an antenna design support apparatus includes a memory, and circuitry coupled to the memory and configured to calculate a plurality of first parameters for determining a structure of a first antenna device based on a specification value set for the first antenna device to be a target of performance evaluation, acquire a communication frequency based on the plurality of first parameters, calculate an allowable range of deviation of the communication frequency satisfying a specified performance evaluation standard of the first antenna device, determine a structure of a second antenna device as a reference model, and obtain a change amount corresponding to change in the communication frequency in the allowable range of two second parameters having a correlation with each other, and acquire a relational expression of two first parameters of the plurality of first parameters that correspond to the two second parameters and that have a correlation with each other, and two first parameters based on the change amount and that have the correlation with each other.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 7 is a diagram illustrating an example of data stored in a memory;

DESCRIPTION OF EMBODIMENTS

Although an existing antenna design computer programs may determine the values of structural parameters (parameters defining the structure of the antenna (hereinafter referred to as parameters)), the program does not take into account parameters that have a correlation with each other.

The calculation amount may be reduced by taking into consideration on the parameters correlated with each other, and all parameters may be calculated more quickly.

Accordingly, an object of the present disclosure is to provide an antenna design support apparatus, a storage medium, and an antenna design support method capable of calculating a parameter related to a structure of an antenna faster.

Hereinafter, embodiments to which the antenna design support apparatus, storage medium in which the antenna design support program is stored, and antenna design support method of the present disclosure are applied will be described below.

EMBODIMENT

Figure 1:
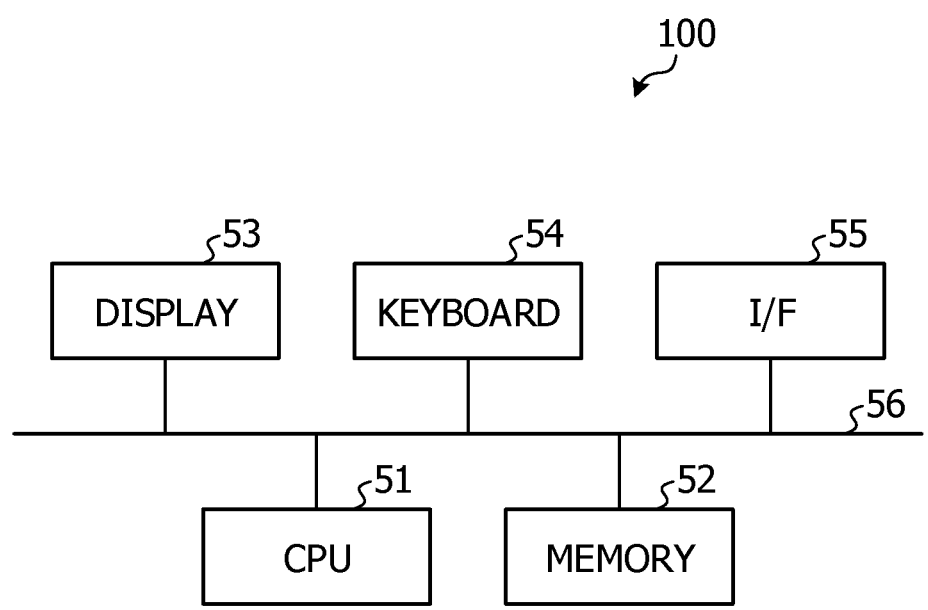
FIG. 1 is a hardware configuration diagram of an antenna design support apparatus according to an embodiment.

FIG. 1 is a hardware configuration diagram of an antenna design support apparatus 100 according to an embodiment. The antenna design support apparatus 100 executes the antenna design support program of the embodiment, and determines parameters for determining the structure of the antenna device according to the user's request. At this time, a relational expression representing the relationship between parameters having a correlation is generated, and by substituting in one parameter into the relational expression, another parameter having a correlation with that parameter is calculated. A method realized by the antenna design support apparatus 100 executing the antenna design support program is an antenna design support method according to this embodiment.

The antenna design support apparatus 100 includes a central processing unit (CPU) 51, a memory 52, a display 53, a keyboard 54, an interface (I/F) 55, and a bus 56.

The CPU 51 is an arithmetic device that implements an antenna design process by reading and executing an antenna design support program recorded in the memory 52.

The memory 52 is a storage device that stores the antenna design support program, results from the CPU 51 executing the program, generated data, and the like. The memory 52 may be a non-volatile memory such as a flash memory or the like, or a volatile memory such as a random-access memory (RAM) or the like. The memory 52 may temporarily store a program that is executed by the CPU 51. As the storage device, in addition to the memory 52, another storage device such as a hard disk drive (HDD) or the like may be used. The display 53, the keyboard 54, the I/F 55, the CPU 51, and the memory 52 are electrically coupled to each other through the bus 56.

The display 53 is a display device that displays a three-dimensional CAD operation screen or the like for creating an analysis target model, and may be integrated with a touch panel.

The keyboard 54 is an input device for a user to externally operate the antenna design support apparatus 100. The I/F 55 is an external coupling device that couples the antenna design support apparatus 100 with an external device.

Figure 2:
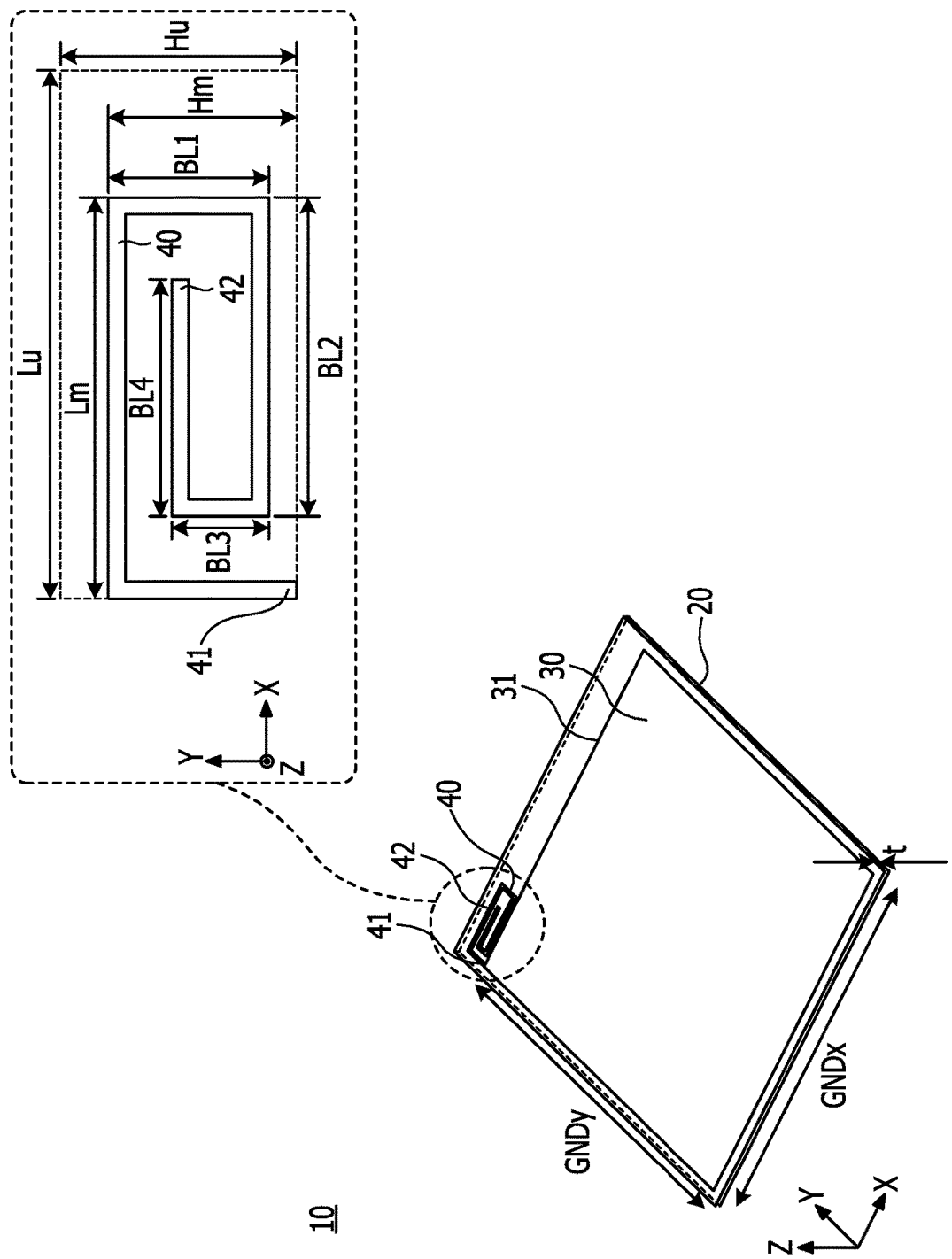
FIG. 2 is a diagram illustrating a model of an antenna device in which parameters are calculated by the antenna design support apparatus.

FIG. 2 is a diagram illustrating a model of an antenna device 10 in which parameters are calculated by the antenna design support apparatus 100. The antenna device 10 is an example of a first antenna device. The antenna device 10 includes a substrate 20, a ground layer (ground plane) 30, and an antenna element 40. The model of the antenna device 10 is used for electromagnetic field simulation.

Hereinafter, an XYZ coordinate system will be described. For convenience of explanation, the −Z direction side is referred to as a lower side or bottom, the +Z direction side is referred to as an upper side or top, however, this does not represent the universal vertical relationship. The plan view is referred to as an XY plane view.

The substrate 20 is a rectangular dielectric substrate in the plan view, and the ground layer 30 is provided on an upper surface thereof. The dielectric constant of the substrate is εr, the thickness is t (mm), and the dielectric loss tangent is tan δ.

The ground layer 30 is a metal layer arranged on the upper surface of the substrate 20, and the dimensions in the X direction and the Y direction in the plan view are GNDx (mm) and GNDy (mm).

The antenna element 40 is provided at an end portion on the −X direction side and the +Y direction side of the upper surface of the substrate 20. The antenna element 40 is arranged within a rectangular arrangement region of Lu (mm) in the X direction and Hu (mm) in the Y direction. The Lu and the Hu are dimensions of the arrangement region set by the user.

The antenna element 40, inside the arrangement region, extends from a feed point 41 in the vicinity of an edge side 31 of the ground layer 30 to an open end 42. As an example, the antenna element 40 is bent 5 times from the feed point 41 to the open end 42 at right angles in a rectangular spiral, as illustrated in FIG. 2.

Since the size (Lu×Hu) of the arrangement region is a fixed value set by the user and the size of the planar region in which the antenna element 40 may be arranged is limited, the number of times of bending increases when the length (the length from the feed point 41 to the open end 42) of the antenna element 40 is increased.

The dimensions of the antenna element 40 are set to a height Hm (mm), a length Lm (mm), a length BL1 (*mm*), a length BL2 (*mm*), a length BL3 (mm), and a length BL4 (*mm*) for each straight section between the feed point 41 and the open end 42. The height Hm (mm) may be smaller than the Hu set by the user, and the length Lm (mm) may be smaller than the Lu set by the user.

The maximum values of the height Hm (mm) and the length Lm (mm) are calculated in order to maximize the antenna element 40 within the arrangement region of Hu (mm)×Lu (mm). The larger the antenna element 40 is, the better the radiation characteristic is, so that the antenna element 40 is maximized within the arrangement region where the space is limited.

When the length of the antenna element 40 becomes short, the length BL1 (*mm*), the length BL2 (*mm*), the length BL3 (*mm*), and the length BL4 (*mm*) become short, and there are some cases where the length BL4 (*mm*), the length BL3 (*mm*), the length BL2 (*mm*), and the length BL1 (*mm*) are not present.

Figure 3:
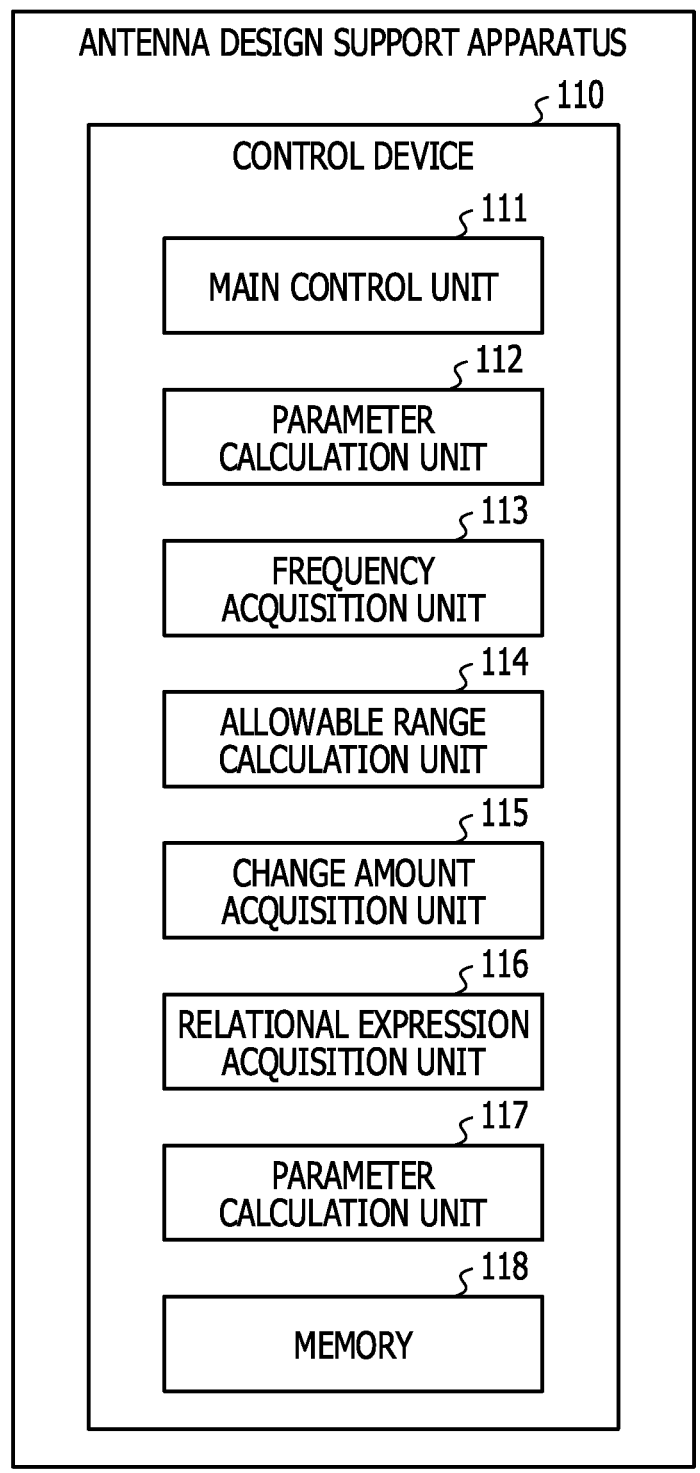
FIG. 3 is a diagram illustrating a functional configuration of the control device of the antenna design support apparatus.

FIG. 3 is a diagram illustrating a functional configuration of the control device 110 of the antenna design support apparatus 100. The function of the control device 110 is achieved by the CPU 51 and the memory 52 illustrated in FIG. 1.

The control device 110 includes a main control unit 111, a parameter calculation unit 112, a frequency acquisition unit 113, an allowable range calculation unit 114, a change amount acquisition unit 115, a relational expression acquisition unit 116, a parameter calculation unit 117, and a memory 118. The main control unit 111, the parameter calculation unit 112, the frequency acquisition unit 113, the allowable range calculation unit 114, the change amount acquisition unit 115, the relational expression acquisition unit 116, and the parameter calculation unit 117 represent the functions of the control device 110, and the memory 118 functionally represents the memory of the control device 110.

The main control unit 111 is a processing unit that supervises the processing of the control device 110, and performs processing other than the processing performed by the main control unit 111, the parameter calculation unit 112, the frequency acquisition unit 113, the allowable range calculation unit 114, the change amount acquisition unit 115, the relational expression acquisition unit 116, and the parameter calculation unit 117. For example, the main control unit 111 has a function as a display processing unit that performs display processing for displaying contents determined by the parameter calculation unit 112, the frequency acquisition unit 113, the allowable range calculation unit 114, the change amount acquisition unit 115, the relational expression acquisition unit 116, and the parameter calculation unit 117 on the display 53.

The parameter calculation unit 112 calculates parameters (structural parameters) for determining the structure of the antenna device 10 to be designed, based on the specification values and the evaluation values inputted by the user. The parameter calculation unit 112 is an example of a first parameter calculation unit. The parameters for determining the structure of the antenna device 10 are an example of first parameters.

The calculation of such parameters may be achieved, for example, by an antenna design computer program as described in Japanese Laid-open Patent Publication No. 2017-142720. The parameter calculation may also be performed by a calculation program other than the antenna design computer program described in Japanese Laid-open Patent Publication No. 2017-142720.

The specification values are, for example, the dimensions of the antenna element 40 of the antenna device 10 to be designed, the minimum value of the communication frequency of the antenna device 10, the maximum value of the communication frequency of the antenna device 10, the sizes (GNDx, GNDy) of the ground layer 30, the dielectric constant of the dielectric (here, the substrate 20) in which the ground layer 30 is arranged, the thickness of the dielectric, the dielectric loss tangent of the dielectric, and the like.

Here, the communication frequency of the antenna device 10 is a frequency equal to the resonance frequency of the antenna device 10 or a frequency included in a frequency band in which the antenna device 10 may communicate in a specified good communication state before and after the resonance frequency of the antenna device 10.

As an example, a description will be given of a form in which the specification values include of the minimum value of the resonance frequency (center frequency) of the antenna device 10, and the maximum value of the resonance frequency (center frequency) of the antenna device 10.

The evaluation values are an upper limit value or a lower limit value of evaluation items such as a specific band (bandwidth/frequency), an S parameter, a gain, radiation efficiency, or the like in a specified frequency band, and are values representing evaluation standards (performance evaluation standards) in the specified frequency band that are determined by the user.

The parameter calculation unit 112, for example, calculates parameters for setting an S11 parameter to a specified value or less in the specified frequency band. Parameters calculated by the parameter calculation unit 112 include, for example, dimensions of the antenna element 40 of the antenna device 10, a gap between the feed point 41 and the ground layer 30 (feed gap), the sizes in the x and y directions in the plan view of the ground layer 30, the dielectric constant of the dielectric (the substrate 20) in which the ground layer 30 is arranged, the dielectric thickness, and the dielectric loss tangent, or the like. These parameters are also the same for evaluation items other than the S11 parameter.

The frequency acquisition unit 113 obtains the frequency characteristic of the antenna device 10 specified by a plurality of parameters calculated by the parameter calculation unit 112 by electromagnetic field simulation, and acquires the communication frequency of the antenna device 10 from the obtained frequency characteristic. As an example, a form in which the frequency acquisition unit 113 acquires the resonance frequency (center frequency) of the antenna device 10 will be described.

The allowable range calculation unit 114 calculates an allowable range of a deviation in a communication frequency satisfying a specified evaluation value (performance evaluation standard) of the antenna device 10. As an example, a description will be given of a form in which the allowable range calculation unit 114 calculates an allowable range of a deviation in the resonance frequency (center frequency) of the antenna device 10. The process for calculating the allowable range by the allowable range calculation unit 114 will be described later.

The change amount acquisition unit 115 determines the structure of the antenna device 10R as a reference model and obtains a change amount corresponding to a change in the resonance frequency within the allowable range of two parameters having correlation with each other. The process will be described in detail later. The two parameters that determine the structure of the antenna device 10R and that have a correlation with each other are an example of second parameters.

The relational expression acquisition unit 116 acquires the relational expression of two parameters based on two parameters among the plurality of parameters calculated by the parameter calculation unit 112 having a correlation with each other and the change amount acquired by the change amount acquisition unit 115. Here, as an example, a description will be given of a form in which the relational expression acquisition unit 116 acquires the relational expression of two parameters based on the change amounts of two parameters corresponding to fluctuations in the resonance frequency acquired by the change amount acquisition unit 115 within the allowable range calculated by the allowable range calculation unit 114.

Of the plurality of parameters calculated by the parameter calculation unit 112, the height Hm and the length Lm of the arrangement region of the antenna element 40 are parameters that define the entire length of the antenna element 40, and the total value of the height Hm and the length Lm is determined according to the resonance frequency of the antenna element 40. Therefore, the height Hm and the length Lm are two parameters that have a correlation with each other.

The antenna device 10 includes a monopole antenna element 40, so the ground layer 30 also contributes to radiation. Therefore, as in the case of the size (height Hm×length Lm) of the arrangement region of the antenna element 40, the length GNDx in the X-axis direction and the length GNDy in the Y-axis direction of the ground layer 30 are also correlated with each other. For example, the length GNDx in the X-axis direction of the ground layer 30 and the length GNDy in the Y-axis direction are two parameters that have a correlation with each other.

The dielectric constant εr of the substrate 20 and the thickness t of the substrate 20 have such a relationship that the dielectric constant εr becomes larger as the thickness t becomes thicker, and therefore, two parameters that have correlation with each other are provided.

The relational expression acquisition unit 116 acquires relational expressions for the two parameters that have a correlation with each other of the three sets of: the height Hm and the length Lm; the length GNDx and the length GNDy, and the dielectric constant εr and the thickness t of the substrate 20.

The parameter calculation unit 117 substitutes one parameter specified by the user into a relational expression acquired by the relational expression acquisition unit 116, and calculates another parameter having correlation with the one parameter substituted in the relational expression. The parameter calculation unit 117 is an example of a second parameter calculation unit.

The memory 118 stores an antenna design support program, an antenna design computer program for achieving the parameter calculation unit 112, data required for executing these programs, and data and the like handled in the process of executing these programs.

Figure 4:
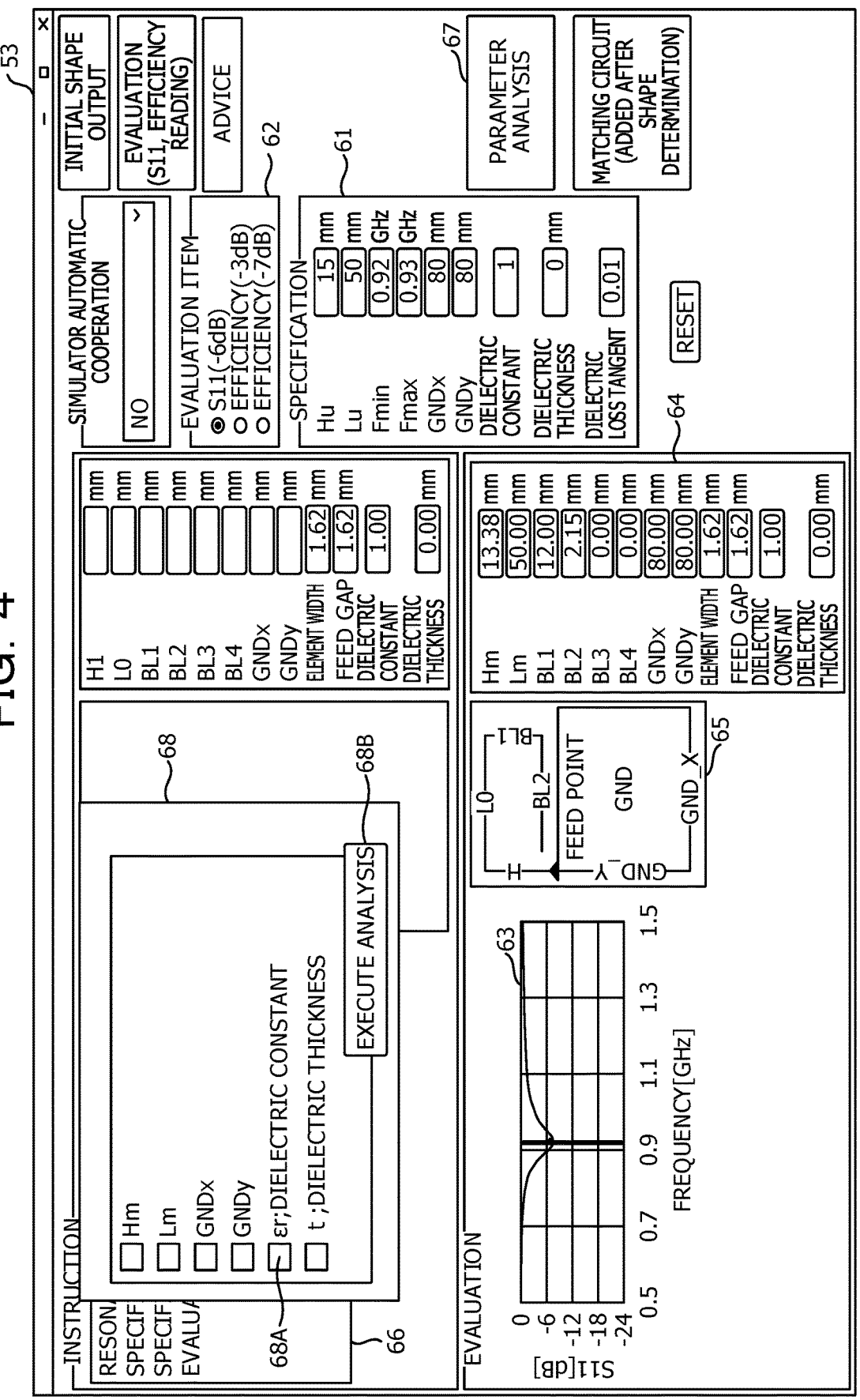
FIG. 4 is a diagram illustrating an example of a display on a display.

FIG. 4 is a diagram illustrating an example of a display on the display 53. FIG. 4 illustrates, for example, a specification value input field 61, an evaluation value selection field 62, an evaluation value display field 63, a calculation parameter display field 64, an antenna shape display field 65, a message display field 66, a parameter analysis start button 67, and an analysis execution window 68, as an example of a display on the display 53. In these display fields, buttons and the like are displayed by a graphic user interface (GUI).

The specification value input field 61 is a field in which the user inputs specification values such as the size (Hu, Lu) of the arrangement region, the minimum value fmin and the maximum value fmax of the resonance frequency, the size GNDx, GNDy of the ground layer 30, and the like. The specification value inputted into the specification value input field 61 is temporarily stored in the memory 118 by the main control unit 111.

The evaluation value selection field 62 is a field for selecting one of a plurality of evaluation items. An example of radio buttons that may be selected from among the three evaluation values of −6 dB of the S11 parameter, −3 dB of radiation efficiency, and −7 dB of the radiation efficiency is illustrated. The evaluation value selected by the user is evaluated in the frequency band between the minimum value fmin of the resonance frequency and the maximum value fmax of the resonance frequency that are inputted by the user. The evaluation value selected in the evaluation value selection field 62 is temporarily stored in the memory 118 by the main control unit 111.

The evaluation value display field 63 is a field for displaying the evaluation value selected in the evaluation value selection field 62. An example is illustrated in which the frequency characteristic of the S11 parameter is a characteristic having an evaluation standard of −6 dB. The frequency acquisition unit 113 obtains the frequency characteristic using the evaluation value, and acquires the resonance frequency from the obtained frequency characteristic.

The calculation parameter display field 64 is a field for displaying the parameter calculated by the parameter calculation unit 112 using the evaluation value selected in the evaluation value selection field 62 and based on the specification value inputted in the specification value input field 61. The main control unit 111 displays the calculated values of various parameters for determining the structure of the antenna device 10 in the calculation parameter display field 64.

The antenna shape display field 65 is a field for displaying a schematic structure of the antenna device 10 represented by the parameters calculated by the parameter calculation unit 112. The main control unit 111 displays the schematic structure of the antenna device 10 in the antenna shape display field 65.

The message display field 66 is a field for displaying messages from the antenna design support apparatus 100, comments from the user in regard to the messages, and the like. The messages include, as an example, a parameter calculated by the parameter calculation unit 112, a resonance frequency acquired by the frequency acquisition unit 113, an allowable range calculated by the allowable range calculation unit 114, a change amount by the change amount acquisition unit 115, a relational expression acquired by the relational expression acquisition unit 116, and a parameter or the like calculated by the parameter calculation unit 117.

The main control unit 111 displays messages generated by the frequency acquisition unit 113, the allowable range calculation unit 114, and the parameter calculation unit 117, and message inputted by the user using to the touch panel or keyboard 54 of the display 53 in the message display field 66.

The parameter analysis start button 67 is a button for starting an analysis process that includes calculation of an allowable range by the allowable range calculation unit 114, acquisition of a change amount by the change amount acquisition unit 115, acquisition of a relational expression by the relational expression acquisition unit 116, and calculation of a parameter by the parameter calculation unit 117.

When calculation of parameters by the parameter calculation unit 112 is completed, the main control unit 111 switches the parameter analysis start button 67 to the active state. The parameter analysis start button 67 is enabled when it is switched to an active state.

When the parameter analysis start button 67 is pressed, the analysis execution window 68 is displayed as a pop-up window by the main control unit 111. The analysis execution window 68 includes a check box 68A for selecting a parameter and an analysis execution button 68B for starting the execution of analysis for the selected parameter.

Figure 5:
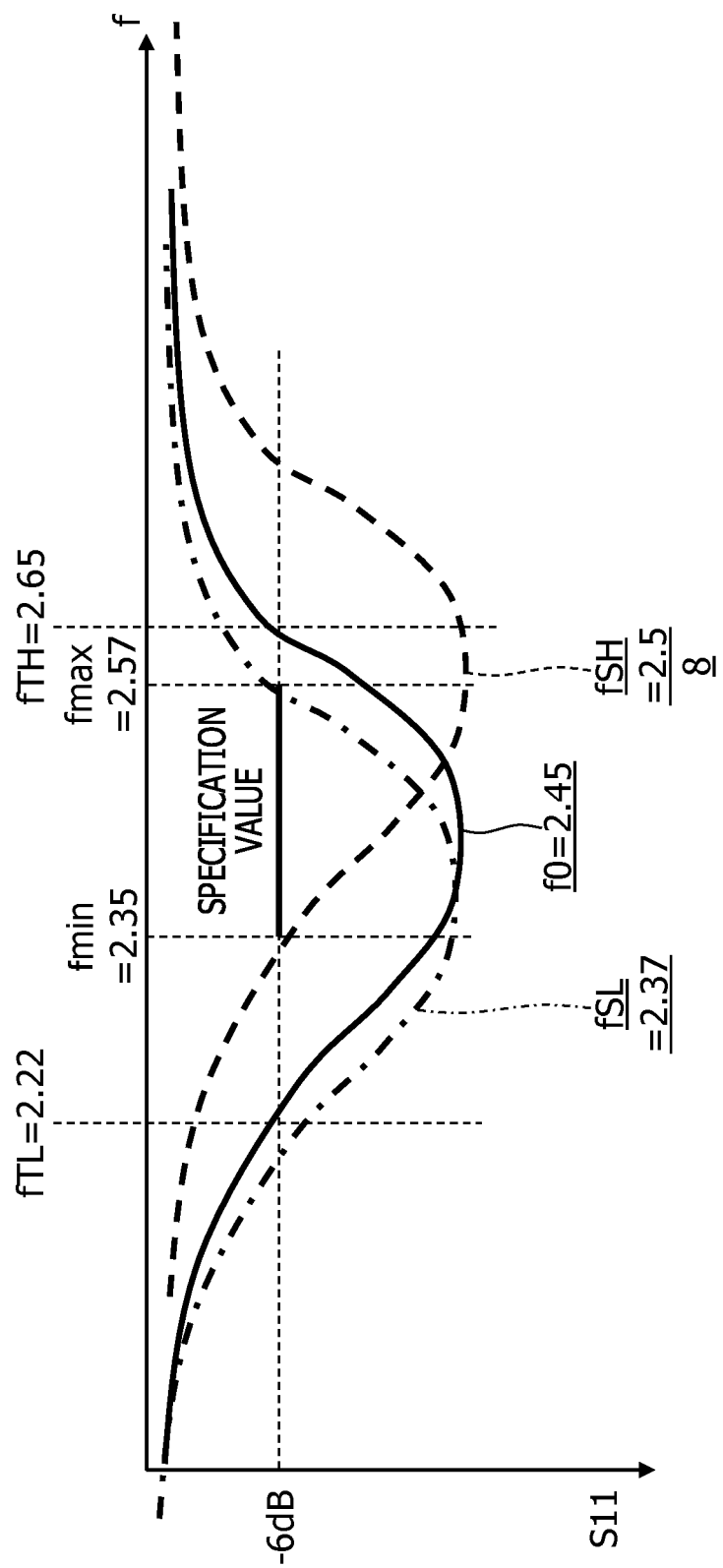
FIG. 5 is a diagram illustrating an allowable range of a resonance frequency calculated by an allowable range calculation unit.

FIG. 5 is a diagram illustrating an allowable range of a resonance frequency f0 calculated by an allowable range calculation unit 114. The horizontal axis is the frequency, and as an example, the vertical axis is the S11 parameter. Here, the reason the vertical axis is used to indicate the S11 parameter, is to explain the case in which the evaluation value inputted by the user is the S11 parameter.

As an example, it is presumed that the minimum value fmin of the resonance frequency is 2.35 GHz, the maximum value fmax of the resonance frequency is 2.57 GHz, and the parameter S11 is −6 dB.

The characteristic indicated by the solid line is the frequency characteristic of the S11 parameter of the antenna device 10 having the structure determined by the parameter calculated by the parameter calculation unit 112. This frequency characteristic may be obtained by performing electromagnetic field simulation by the frequency acquisition unit 113 using parameters calculated by the parameter calculation unit 112 (the dimension of the antenna element 40, the feed gap, the size in the x direction and the y direction of the ground layer 30 (GNDx, GNDy), the dielectric constant, the dielectric thickness, the dielectric loss tangent, and the like).

The frequency acquisition unit 113 obtains the resonance frequency f0 from the obtained frequency characteristic. The resonance frequency f0 is a frequency at which the S11 parameter takes a minimum value. As an example, it is assumed that the resonance frequency f0 is 2.45 GHz. The frequency fTL on the low-frequency side, where the value of the S11 parameter of the frequency characteristic having a resonance frequency f0 of 2.45 GHz becomes an evaluation value of −6 dB, is 2.22 GHz, and the frequency fTH on the high-frequency side is 2.65 GHz. These frequencies are obtained by electromagnetic field simulation.

The allowable range calculation unit 114 shifts the frequency characteristic indicated by the solid line obtained by the frequency acquisition unit 113 in the horizontal axis direction, thereby calculating a range of frequencies satisfying the evaluation value inputted by the user.

Since the S11 parameter is a reflection coefficient, the range in which evaluation value of the S11 parameter becomes −6 dB or less in the frequency band of 2.35 GHz to 2.57 GHz becomes an operation region in which the evaluation value is cleared. For example, when the frequency characteristic indicated by the solid line is shifted in the horizontal axis direction, the range in which the S11 parameter becomes −6 dB or less in the frequency band of 2.35 GHz to 2.57 GHz becomes the allowable range of shift in the resonance frequency.

When the frequency characteristic indicated by the solid line is shifted to the high frequency side (the right side on the horizontal axis), the frequency characteristic in which the S11 parameter becomes −6 dB is obtained at 2.35 GHz, which is the minimum value fmin of the resonance frequency, such as the frequency characteristic indicated by the broken line. The characteristic indicated by the broken line gives an upper limit resonance frequency fSH that satisfies the evaluation value. The resonance frequency fSH is, as an example, 2.58 GHz. The resonance frequency fSH is obtained by an electromagnetic field simulation.

When the frequency characteristic indicated by the solid line is shifted to the low frequency side (the left direction side of the horizontal axis), the frequency characteristic in which the S11 parameter becomes −6 dB is obtained at 2.57 GHz, which is the maximum value fmax of the resonance frequency, such as the frequency characteristic indicated by the dot-dash line. The characteristic indicated by the broken line gives a lower limit resonance frequency fSL that satisfies the evaluation value. The resonance frequency fSL is, as an example, 2.37 GHz. The resonance frequency fSL is determined by an electromagnetic field simulation.

The resonance frequencies fSH and fSL may be expressed by the following expressions (1) and (2), respectively.

$$fSH = f0 + (fmin - fTL) \quad (1)$$

$$fSL = f0 + (fTH - fmax) \quad (2)$$

Figure 6:
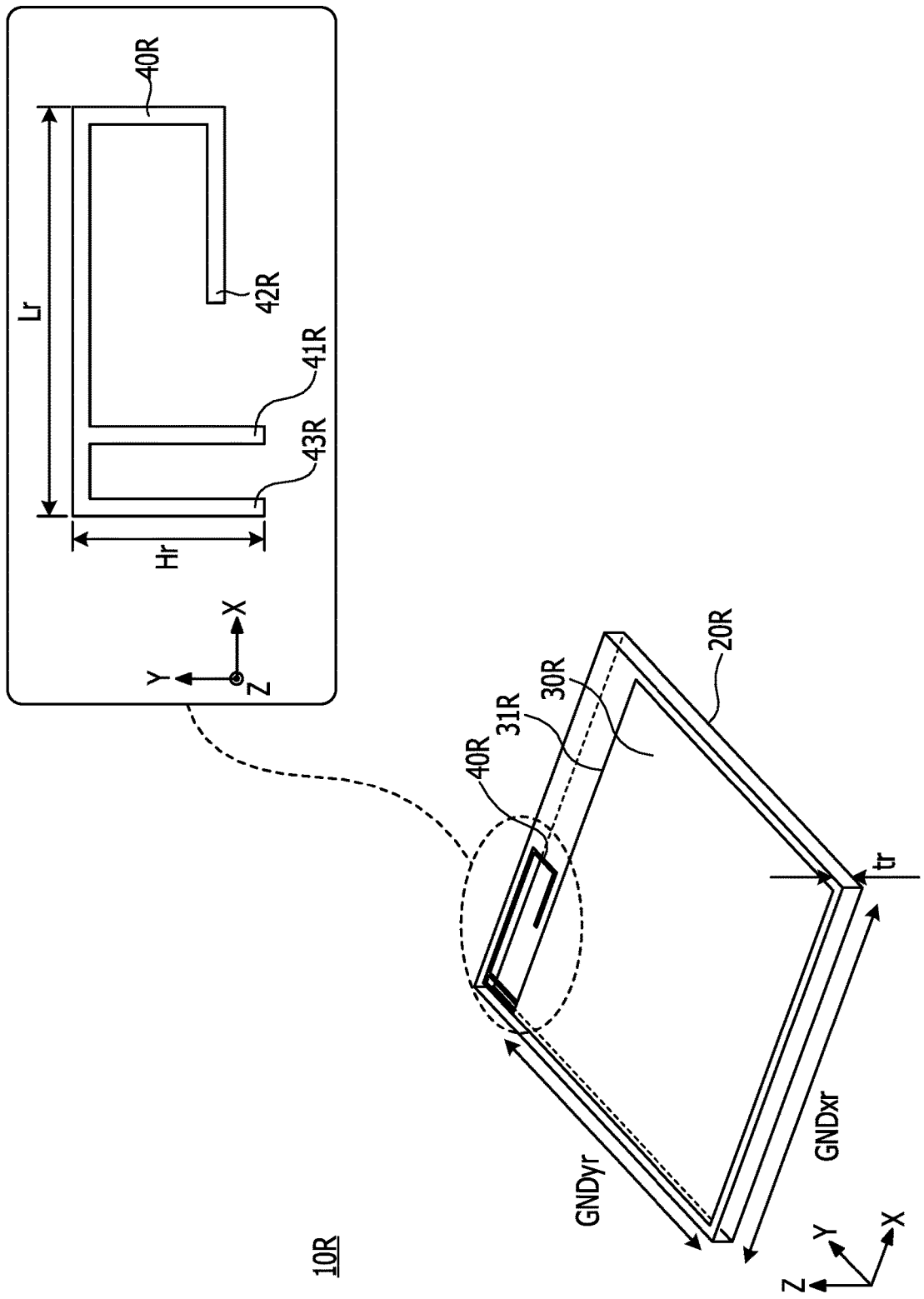
FIG. 6 is a diagram illustrating a model of an antenna device used by the antenna design support apparatus.

FIG. 6 is a diagram illustrating a model of an antenna device 10R used by the antenna design support apparatus 100. The antenna device 10R is an example of a second antenna device. The antenna device 10R is used as a reference model, and includes a substrate 20R, a ground layer (ground plane) 30R, and an antenna element 40R. The XYZ coordinate system is the same as that illustrated in FIG. 2.

The substrate 20R is a rectangular dielectric substrate in the plan view, and the ground layer 30R is provided on the upper surface thereof. The dielectric constant of the substrate is εrr, the thickness is tr (mm), and the dielectric tangent is tan δr.

The ground layer 30R is a metal layer arranged on an upper surface of the substrate 20R, and the dimensions in the X direction and the Y direction in the plan view are GNDxr (mm) and GNDyr (mm).

The antenna element 40R is provided at an end portion on the −X direction side and the +Y direction side of the upper surface of the substrate 20R. The antenna element 40R is an inverted F-shaped monopole antenna element, and is arranged in a rectangular arrangement region having dimensions Lr (mm) in the X direction and Hr (mm) in the Y direction. The Lr and the Hr are dimensions of the arrangement region set by the user.

Inside the arrangement region, the antenna element 40R extends while being bent from a feeding point 41R near the edge side 31 of the ground layer 30R to an open end 42R. As an example, the antenna element 40R is bent at a right angle 3 times from the feeding point 41R to the open end 42R as illustrated in FIG. 6. Since the antenna element 40R has an inverted F shape, the tip 43R of the short circuit line is coupled to the edge side 31R of the ground layer 30R.

The antenna design support apparatus 100 stores data representing the antenna device 10R parameters (size of the arrangement region of the antenna element 40R (height Hr×length Lr), gap between the feed point 41R and the ground layer 30R (feed gap), the sizes in the x direction and the y direction in the plan view of the ground layer 30R (GNDxr, GNDyr), a dielectric constant εrr of the substrate 20R, a thickness tr of the substrate 20R, dielectric loss tangent tan δr of the substrate 20R, and the like) in the memory 118.

In the same manner as described for the antenna device 10, of these parameters, the height Hr and the length Lr, the length GNDxr and the length GNDyr, and the dielectric constant εrr and the thickness tr, are each set of two parameters that have a correlation with each other.

The antenna design support apparatus 100 stores, in the memory 118, data representing a characteristic representing a relationship between the height Hr and the length Lr, data representing a characteristic representing a relationship between the length GNDxr and the length GNDyr, and data representing a characteristic representing a relationship between the dielectric constant εrr and the thickness tr at a plurality of resonance frequencies of the antenna device 10R, and this data may be displayed on the display 53.

FIG. 7 is a diagram illustrating an example of data stored in the memory 118. FIG. 7 illustrates data representing a characteristic representing a relationship between the height Hr and the length Lr, data representing a characteristic representing a relationship between the length GNDxr and the length GNDyr, and data representing a characteristic representing a relationship between the dielectric constant εrr and the thickness tr at a plurality of resonance frequencies of the antenna device 10R.

As an example, the resonance frequency includes 5 kinds of frequencies from 2.3 GHz up to 2.7 GHz in increments of 0.1 GHz. The characteristic representing the relationship between the height Hr and the length Lr represents the length Lr by using a function with a height Hr as a parameter at each resonance frequency. Similarly, at each resonance frequency, the length GNDyr is represented by a function having the length GNDxr as a parameter, and the thickness tr is represented by a function using the dielectric constant εrr as a parameter.

Figure 8:
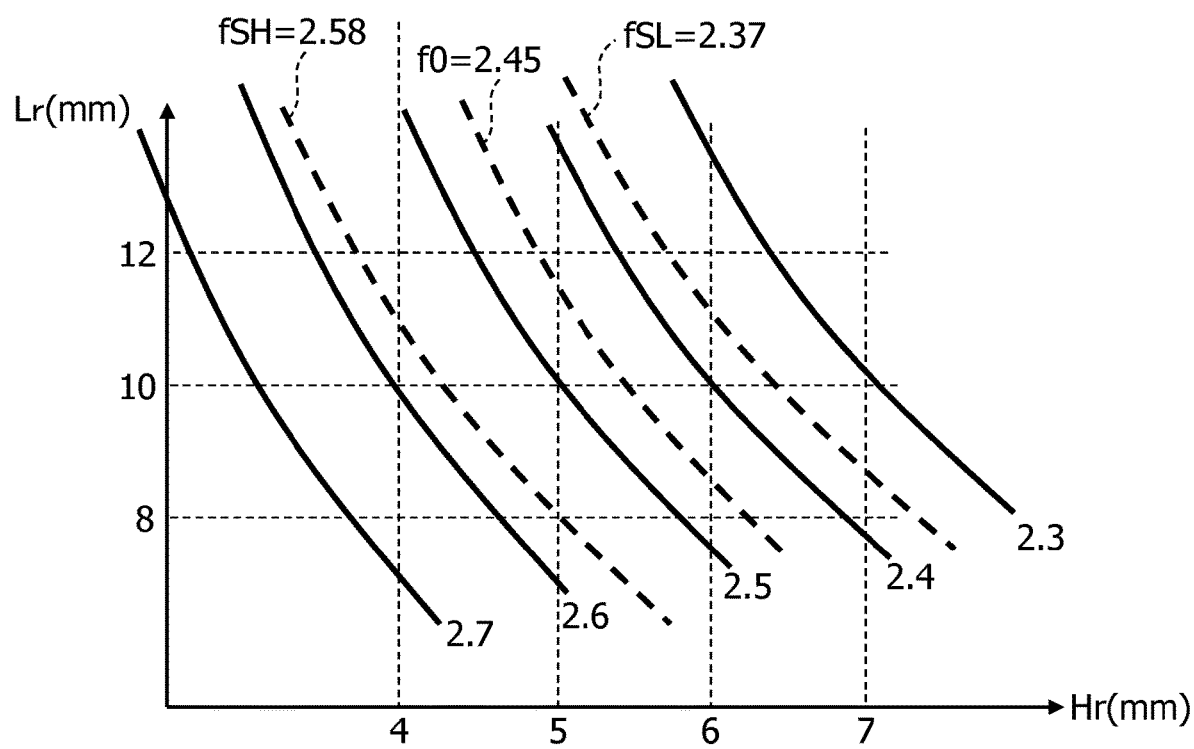
FIG. 8 is a diagram illustrating a characteristic representing the relationship between height and length.

FIG. 8 is a diagram illustrating a characteristic representing the relationship between the height Hr and the length Lr. In FIG. 8, the horizontal axis represents the height Hr of the antenna device 10R, and the vertical axis represents the length Lr of the antenna device 10R. The length GNDxr, the length GNDyr, the dielectric constant εrr, and the thickness tr are constants.

FIG. 8 illustrates the characteristic representing a relationship between the height Hr and the length Lr at a plurality of resonance frequencies of the antenna device 10R, and a relationship between the height Hr and the length Lr at the resonance frequencies f0, fSH, and fSL obtained by the change amount acquisition unit 115.

The change amount acquisition unit 115 reads from the memory 118, the characteristics indicated by solid lines having a resonance frequency of 2.3 GHz, 2.4 GHz, 2.5 GHz, 2.6 GHz, and 2.7 GHz as characteristics indicating a relationship between the height Hr and the length Lr at a plurality of resonance frequencies of the antenna device 10R, and plots the characteristics.

Then, by an interpolation process, the change amount acquisition unit 115 obtains a characteristic representing the relationship between the height Hr and the length Lr for three resonance frequencies: the resonance frequency f0 (2.45 GHz) acquired by the frequency acquisition unit 113, and the resonance frequencies fSH (2.58 GHz) and fSL (2.37 GHz) calculated based on the expressions (1) and (2) by the allowable range calculation unit 114.

The interpolation process is a process in which the characteristics of 3 resonance frequencies f0 (2.45 GHz), fSH (2.58 GHz), and fSL (2.37 GHz) are obtained by proportional calculation based on the frequency characteristics of the 5 resonance frequencies (2.3 GHz, 2.4 GHz, 2.5 GHz, 2.6 GHz, and 2.7 GHz) of the antenna device 10R.

The characteristics of the 3 resonance frequencies f0 (2.45 GHz), fSH (2.58 GHz), and fSL (2.37 GHz) obtained by the interpolation process are as indicated by the broken lines in FIG. 8.

Figure 9:
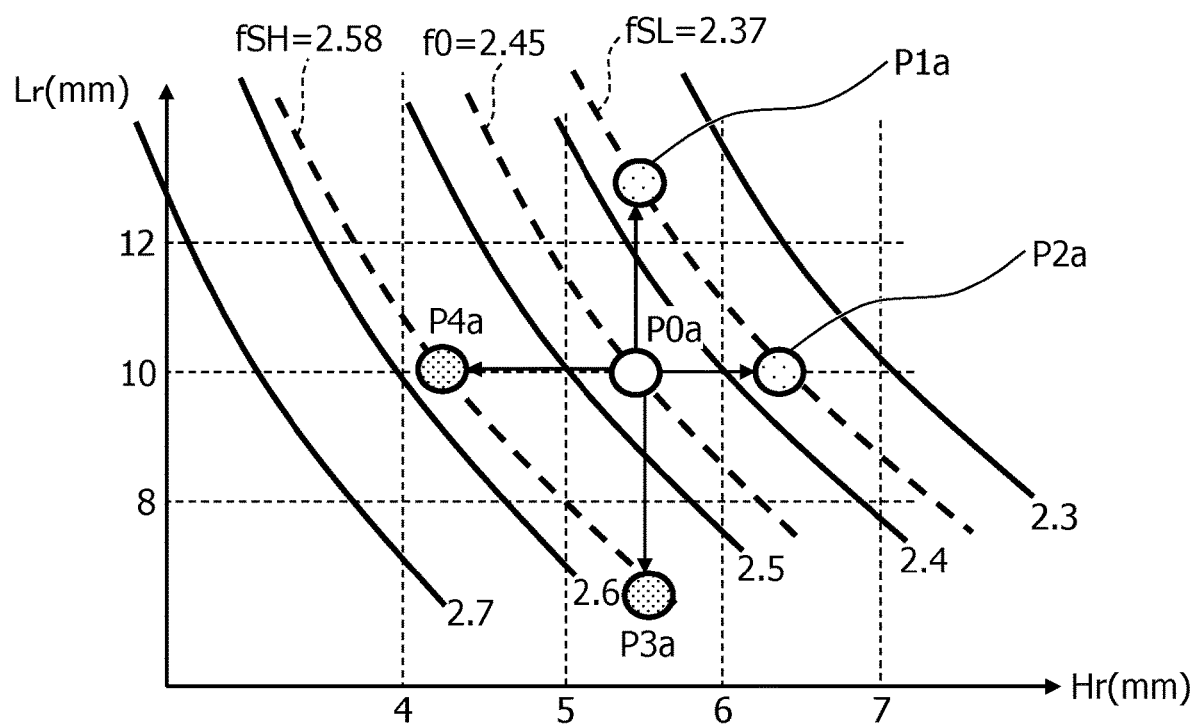
FIG. 9 is a diagram illustrating a process for obtaining a conversion value of the height and the length for resonance frequencies.

FIG. 9 is a diagram illustrating a process for obtaining a conversion value (change amount) of the height Hr and the length Lr with respect to the resonance frequencies fSH and fSL. In FIG. 9, the horizontal axis represents the height Hr of the antenna device 10R, and the vertical axis represents the length Lr of the antenna device 10R.

The change amount acquisition unit 115 selects an arbitrary point P0a on the resonance frequency f0. As an example, it is presumed that the coordinates (Hr, Lr) of the point P0a are (5.4, 10). The coordinates (Hr, Lr) of a point P1a to which the point P0a is moved on a characteristic curve of the resonance frequency fSL in which Hr is fixed are (5.4, 13). The coordinates (Hr, Lr) of a point P2a to which the point P0a is moved on the characteristic curve of the resonance frequency fSL in which Lr is fixed are (6.4, 10).

The change amount acquisition unit 115 acquires 13/10 as a conversion value (change amount) of the length Lr from the point P0a to the point P1a. Further, the change amount acquisition unit 115 acquires 6.4/5.4 as a conversion value (change amount) of the length Hr from the point P0a to the point P2a.

Next, the relationship between the points P1a and P2a with respect to the point P0a is obtained for the height Hm and the length Lm of the antenna element 40.

Figure 10:
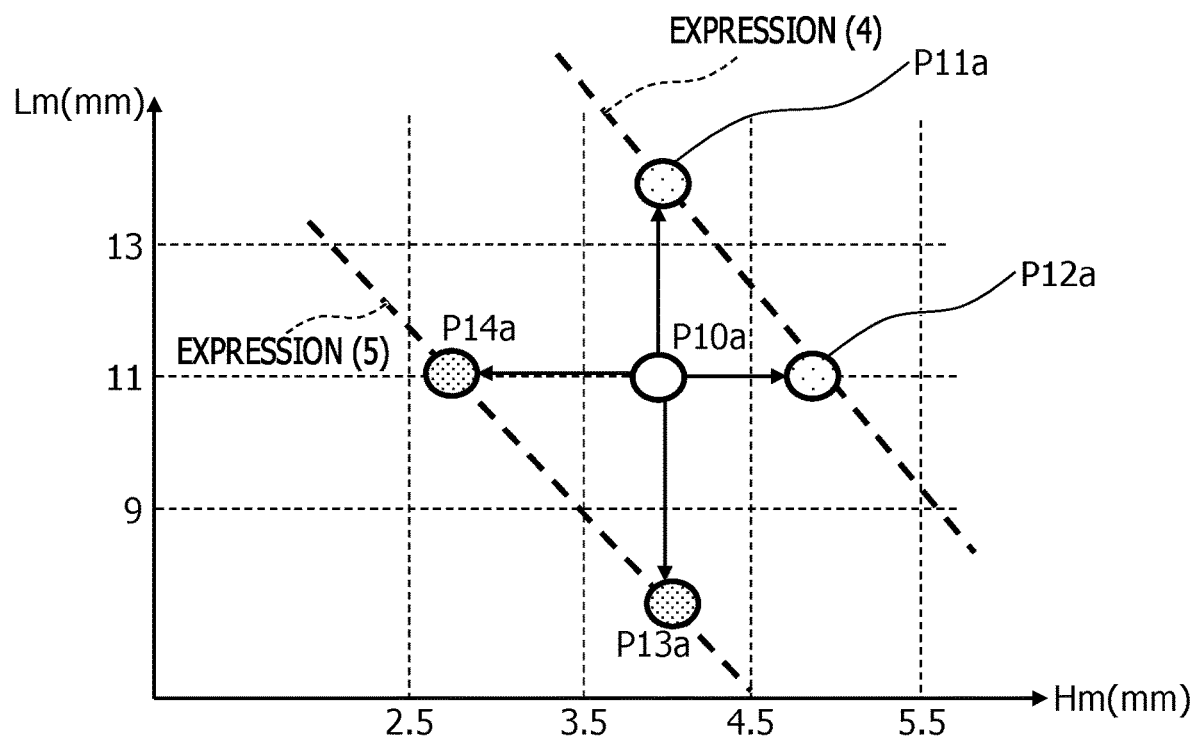
FIG. 10 is a diagram illustrating a process for obtaining a conversion value of the height and the length for the resonance frequencies.

FIG. 10 is a diagram illustrating a process for obtaining a conversion value of the height Hr and the length Lr for the resonance frequencies fSH and fSL. In FIG. 10, the horizontal axis represents the height Hm of the antenna element 40, and the vertical axis represents the length Lr of the antenna element 40. It is presumed that the height Hm and the length Lm of the antenna element 40 calculated by the parameter calculation unit 112 are 4 mm and 11 mm, respectively.

The coordinates of a point P11a and a point P12a with respect to a point P10a that correspond to the point P1a and the point P2a with respect to the point P0a in FIG. 9 are obtained by using the coordinates (Hm, Lm)=(4, 11) of the point P10a representing the height Hm and the length Lm of the antenna element 40 at 2.45 GHz. The point P11a is an example of a first coordinate point, and the point P12a is an example of a second coordinate point.

Since the point P11a with respect to the point P10a is a point on the resonance frequency fSL corresponding to the point P1a with respect to the point P0a in FIG. 9, the value on the horizontal axis of the point P11a is 4. Further, the value on the vertical axis of the point P11a is 11×(13/10)=14.3. For example, the coordinates (Hm, Lm) of the point P11a are (4, 14.3).

Since the point P12a with respect to the point P10a is a point on the resonance frequency fSL corresponding to the point P2a with respect to the point P0a in FIG. 9, the value on the vertical axis of the point P12a is 11. Further, the value of the horizontal axis of the point P12a is 4×(6.4/5.4)=4.7. For example, the coordinates (Hm, Lm) of the point P12a are (4.7, 11). Note that the value is rounded off at the second decimal place.

The relational expression acquisition unit 116 obtains a straight line passing through the point P11a and the point P12a as a relational expression between the height Hm and the length Lm of the antenna element 40 of the antenna device 10 at the resonance frequency fSL. The relational expression is represented by the following general expression (3).

$$Lm = \alpha Hm + \beta \quad (3)$$

Here, using the coordinates of the point P11a and the point P12a, $\alpha = -4.46$ and $\beta = 32.1$ are obtained, and the relational expression of the height Hm and the length Lm of the antenna element 40 of the antenna device 10 at the resonance frequency fSL is obtained as the following expression (4). The expression (4) is an example of a first relational expression.

$$Lm = -4.46\, Hm + 32.1 \quad (4)$$

Similarly, the relational expression acquisition unit 116 uses coordinates of points P13a and P14a corresponding to the point P3a and the point P4a in FIG. 9 to obtain a relational expression between the height Hm and the length Lm of the antenna element 40 of the antenna device 10 at the resonance frequency fSH, which is a straight line passing through the point P13a and the point P14a, as the following expression (5). Note that the point P13a is an example of a third coordinate point, the point P14a is an example of a fourth coordinate point, and the expression (5) is an example of the second relational expression.

$$Lm = -4.95\, Hm + 26.4 \quad (5)$$

Therefore, the upper limit and the lower limit of the height Hm and the length Lm of the antenna element 40 within the allowable range satisfying the allowable value set by the user are expressed by the expressions (4) and (5), respectively.

Therefore, when a combination of the height Hm and the length Lm at which the S11 parameter becomes −6 dB or less is obtained at the maximum value fmax of the resonance frequency and the minimum value fmin of the resonance frequency that are inputted by the user, by substituting either one of the height Hm or the length Lm into the expressions (4) and (5), the other value is obtained.

Next, a description will be given of a relational expression with respect to the lengths GNDx and GNDy of the ground layer 30.

Figure 11:
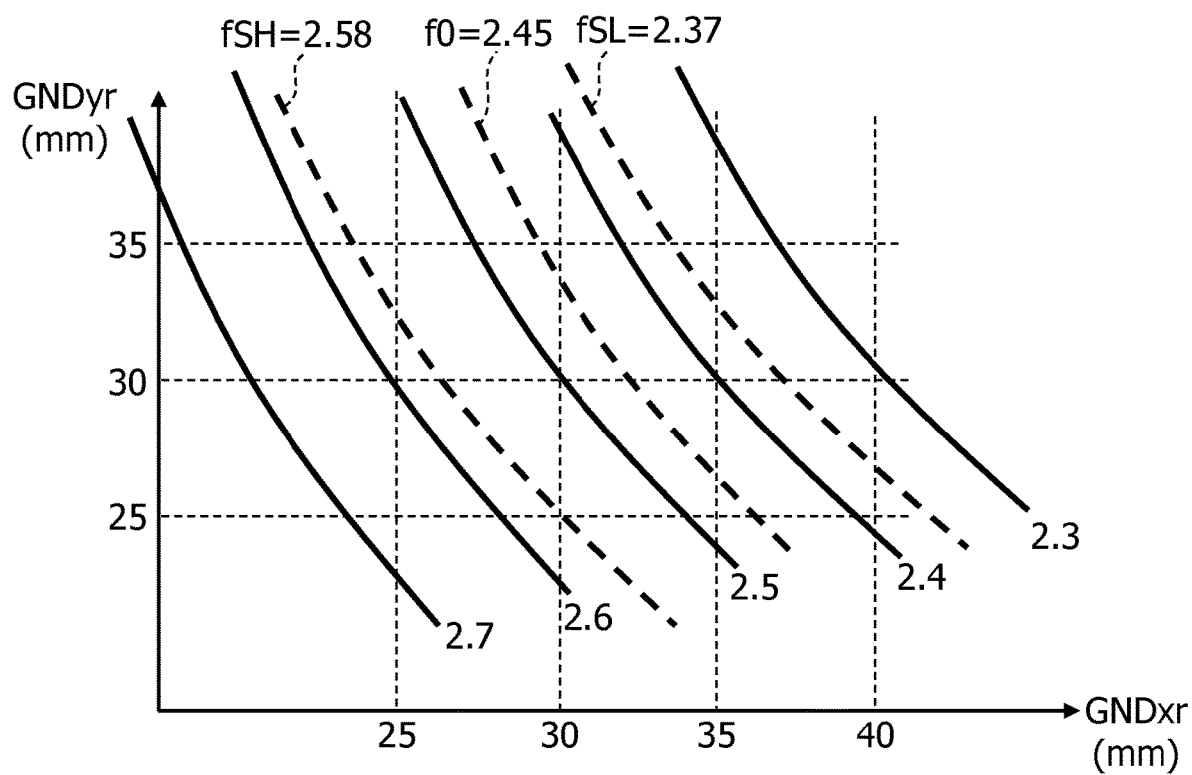
FIG. 11 is a diagram illustrating characteristics representing a relationship between a length and a length.

FIG. 11 is a diagram illustrating characteristics representing a relationship between the length GNDxr and the length GNDyr. In FIG. 11, the horizontal axis represents the length GNDxr of the antenna device 10R, and the vertical axis represents the length GNDyr of the antenna device 10R. The height Hr, the length Lr, the dielectric constant εrr, and the thickness tr are presumed to be constants.

FIG. 11 illustrates the characteristics representing the relationship between the length GNDxr and the length GNDyr at the plurality of resonance frequencies of the antenna device 10R, and a relationship between the length GNDxr and the length GNDyr at the resonance frequencies f0, fSH, and fSL obtained by the change amount acquisition unit 115.

The change amount acquisition unit 115 reads from the memory 118, characteristics indicated by solid lines having a resonance frequency of 2.3 GHz, 2.4 GHz, 2.5 GHz, 2.6 GHz, and 2.7 GHz, as a characteristic indicating a relationship between the length GNDxr and the length GNDyr at a plurality of resonance frequencies of the antenna device 10R, and plots the characteristics.

Then, by an interpolation process, the change amount acquisition unit 115 obtains the characteristic representing the relationship between the length GNDxr and the length GNDyr for three resonance frequencies: the resonance frequency f0 (2.45 GHz) acquired by the frequency acquisition unit 113, and the resonance frequencies fSH (2.58 GHz) and fSL (2.37 GHz) calculated by the allowable range calculation unit 114 based on the expressions (1) and (2). The interpolation process is a process obtained by proportional calculation in the same manner as the case of the height Hr and the length Lm.

The characteristics of the three resonance frequencies f0 (2.45 GHz), fSH (2.58 GHz), and fSL (2.37 GHz) obtained by the interpolation process are as indicated by broken lines in FIG. 11.

Figure 12:
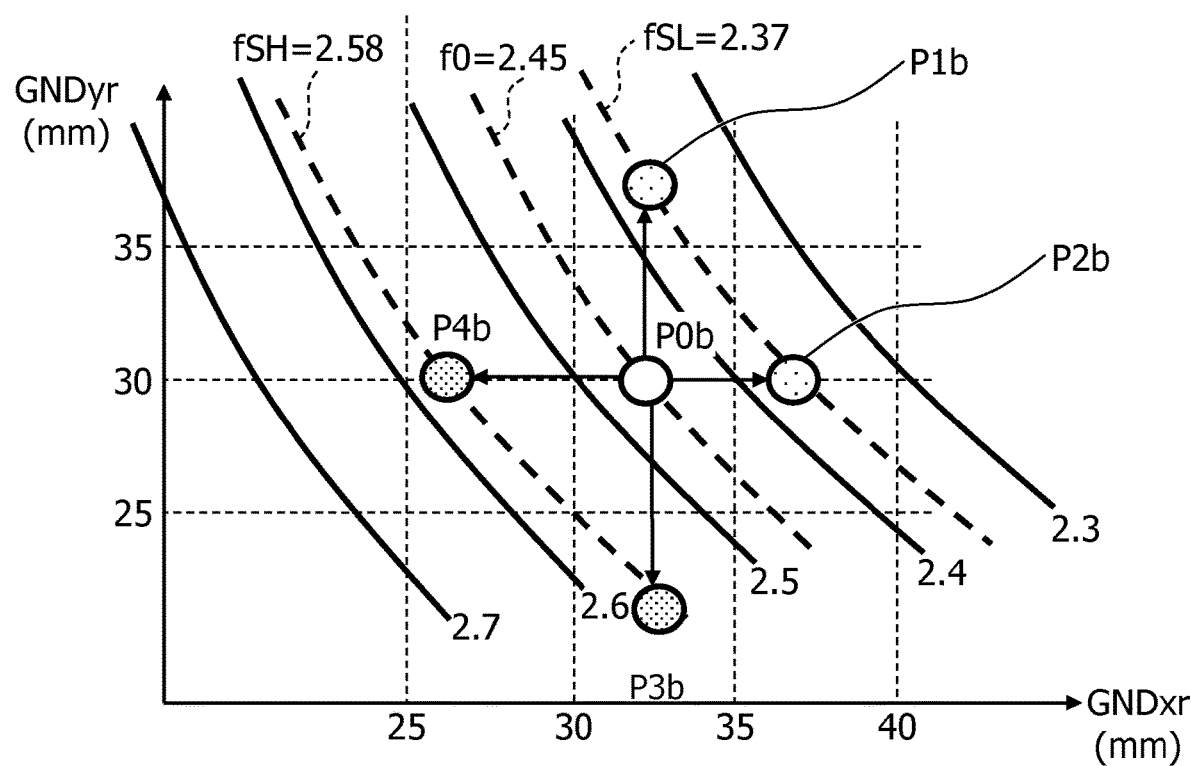
FIG. 12 is a diagram illustrating a process for obtaining a conversion value of the length and the length for the resonance frequencies.

FIG. 12 is a diagram illustrating a process for obtaining a conversion value (change amount) of the length GNDxr and the length GNDyr for the resonance frequencies fSH and fSL. In FIG. 12, the horizontal axis represents the length GNDxr of the antenna device 10R, and the vertical axis represents the length GNDyr of the antenna device 10R.

The change amount acquisition unit 115 selects an arbitrary point P0b on the resonance frequency f0. As an example, it is presumed that the coordinates (GNDxr, GNDyr) of the point P0b are (32, 30). The coordinates (GNDxr, GNDyr) of the point P1b to which point P0b is shifted on the characteristic curve of the resonance frequency fSL with GNDxr fixed are (32, 37). The coordinates (GNDxr, GNDyr) of a point P2b to which point P0b is shifted on the characteristic curve of the resonance frequency fSL with GNDyr fixed are (37, 30).

The change amount acquisition unit 115 acquires 37/30 as a conversion value (change amount) of the length GNDyr from the point P0b to the point P1b. Further, as a conversion value (change amount) of the length GNDxr from the point P0b to the point P2b, 37/32 is acquired.

Next, the relationship of the points P1b, P2b with respect to the point P0b is obtained for the lengths GNDx and GNDy of the antenna device 10.

Figure 13:
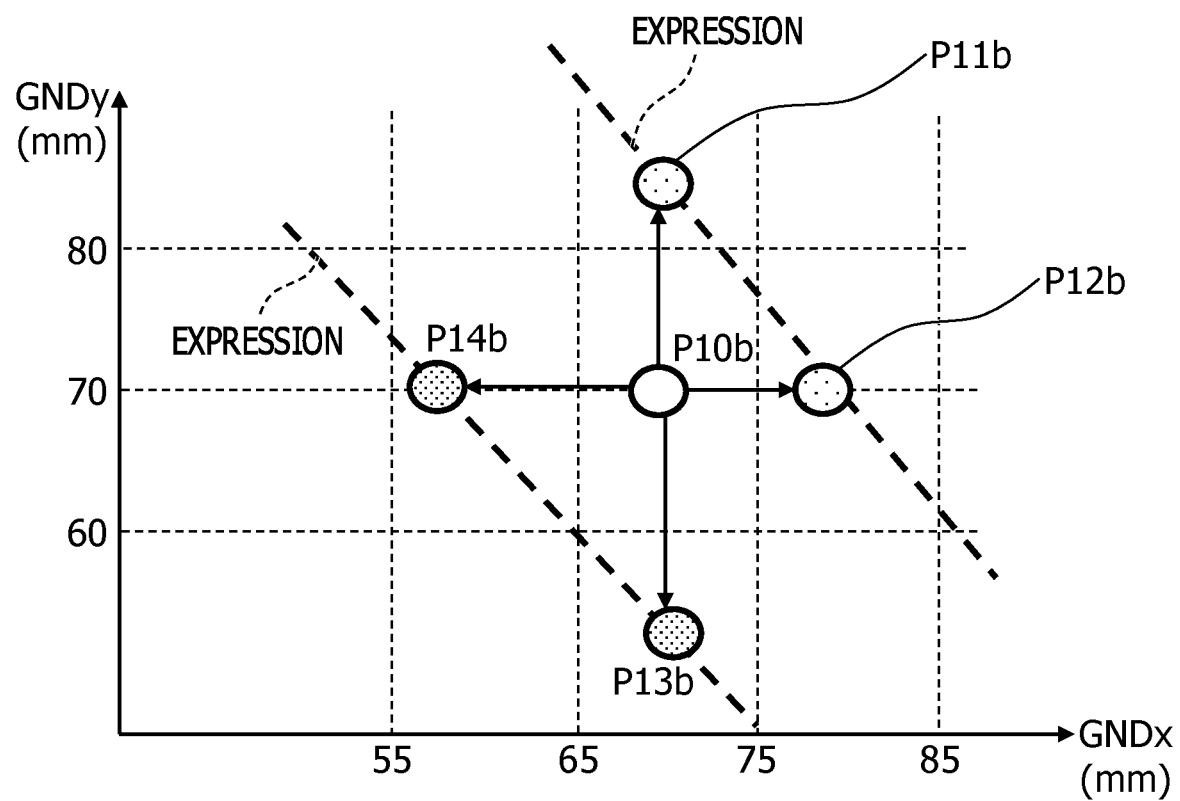
FIG. 13 is a diagram illustrating a process for obtaining a conversion value of the length and the length for the resonance frequencies.

FIG. 13 is a diagram illustrating a process for obtaining a conversion value of the length GNDxr and the length GNDyr for the resonance frequencies fSH and fSL. In FIG. 13, the horizontal axis represents the length GNDx of the antenna device 10, and the vertical axis represents the length GNDy of the antenna device 10. It is presumed that the lengths GNDx and GNDy of the antenna device 10 calculated by the parameter calculation unit 112 are 70 mm and 70 mm, respectively.

Here, by using the coordinates (Hm, Lm)=(70, 70) of the point P10b representing the lengths GNDx and GNDy of the antenna device 10 at the frequency of 2.45 GHz, the coordinates of the point P11b and the point P12b with respect to point P10b, that correspond to the point P1b and the point P2b with respect to the point P0b in FIG. 12 are obtained.

Since the point P11b with respect to the point P10b is a point on the resonance frequency fSL corresponding to the point P1b with respect to the point P0b in FIG. 12, the value on the horizontal axis of the point P11b is 70. Further, the value on the vertical axis of the point P11b is 70×(37/30)=86.3. For example, the coordinates (Hm, Lm) of the point P11b are (70, 86.3).

Since the point P12b with respect to point P10b is a point on the resonance frequency fSL corresponding to the point P2b with respect to the point P0b in FIG. 12, the value on the vertical axis of the point P12b is 70. Further, the value of the horizontal axis of the point P12b is 70×(37/32)=80.9. For example, the coordinates (Hm, Lm) of the point P11b are (80.9, 70). Note that the value is rounded off at the second decimal place.

Similar to the relational expression (4) for the height Hm and the length Lm, the relational expression acquisition unit 116 may obtain a straight line passing through the point P11b and the point P12b as a relational expression between the lengths GNDx and GNDy of the antenna device 10 at the resonance frequency fSL.

Similar to the relational expression (5) for the height Hm and the length Lm, the relational expression acquisition unit 116 may obtain a straight line passing through the point P13b and the point P14b as a relational expression between the lengths GNDx and GNDy of the antenna device 10 at the resonance frequency fSH.

Next, the relational expression for the dielectric constant εr and the thickness t of the substrate 20 will be described.

Figure 14:
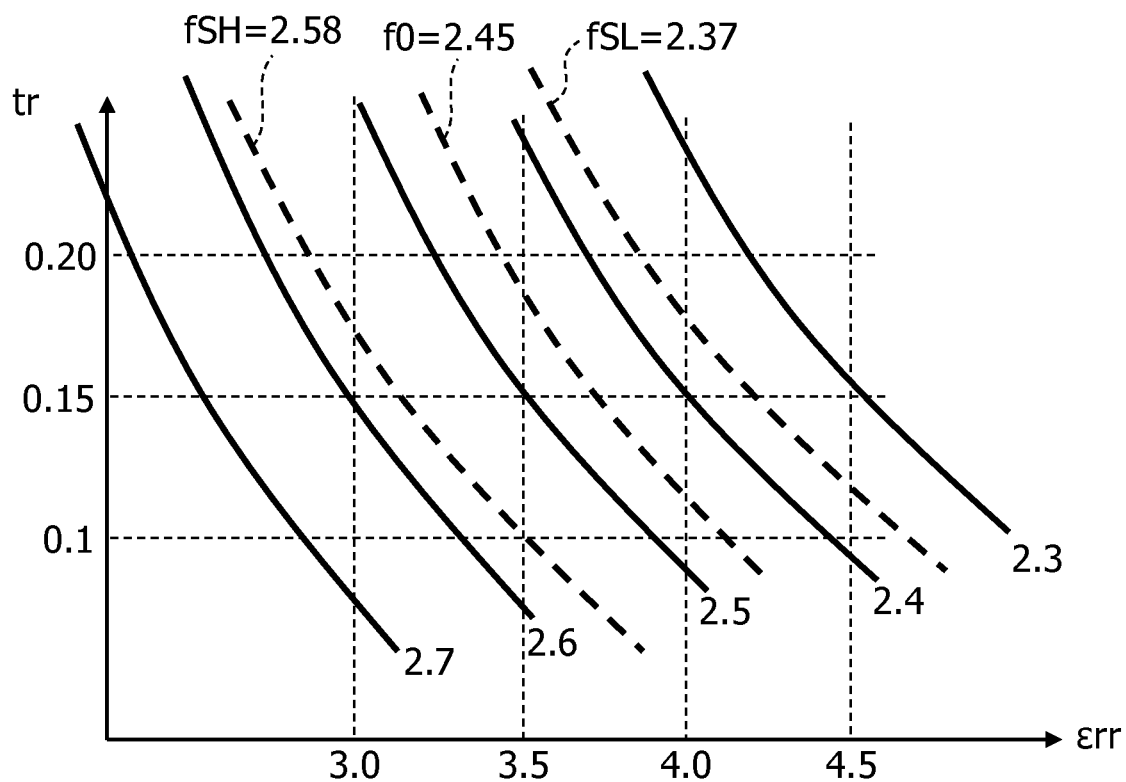
FIG. 14 is a diagram illustrating a characteristic representing a relationship between a dielectric constant and a thickness.

FIG. 14 is a diagram illustrating a characteristic representing a relationship between a dielectric constant εrr and the thickness tr. In FIG. 14, the horizontal axis represents the dielectric constant εrr of the substrate 20R of the antenna device 10R, and the vertical axis represents the thickness tr of the substrate 20R of the antenna device 10R. Here, it is presumed that the height Hr, the length Lr, the length GNDxr, and the length GNDyr are constant.

FIG. 14 illustrates the characteristic representing the relationship between the dielectric constant εrr and the thickness tr at the plurality of resonance frequencies of the antenna device 10R, and a relationship between the dielectric constant εrr and the thickness tr at the resonance frequencies f0, fSH, fSL obtained by the change amount acquisition unit 115.

The change amount acquisition unit 115 reads from the memory 118, characteristics indicated by solid lines having resonance frequencies of 2.3 GHz, 2.4 GHz, 2.5 GHz, 2.6 GHz, and 2.7 GHz as characteristics representing the relationship between the dielectric constant εrr and the thickness tr at a plurality of resonance frequencies of the antenna device 10R, and plots the characteristics.

Then, by an interpolation process, the change amount acquisition unit 115 obtains the characteristic representing the relationship between the dielectric constant εrr and the thickness tr for three resonance frequencies: the resonance frequency f0 (2.45 GHz) acquired by the frequency acquisition unit 113, and the resonance frequencies fSH (2.58 GHz) and fSL (2.37 GHz) calculated by the allowable range calculation unit 114 based on the expressions (1) and (2). The interpolation process is a process obtained by proportional calculation in the same manner as the case of the height Hr and the length Lm.

The characteristics of the 3 resonance frequencies f0 (2.45 GHz), fSH (2.58 GHz), and fSL (2.37 GHz) obtained by the interpolation process are as indicated by the broken lines in FIG. 14.

Figure 15:
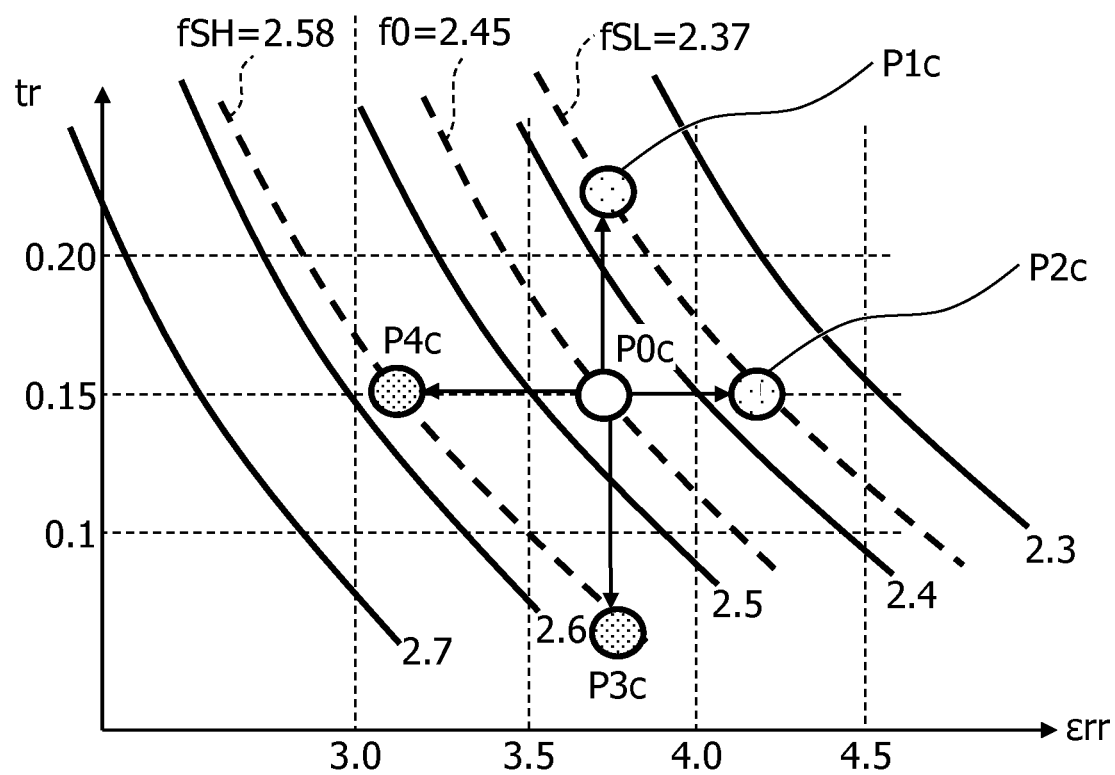
FIG. 15 is a diagram illustrating a process for obtaining a conversion value of the dielectric constant and the thickness for the resonance frequencies.

FIG. 15 is a diagram illustrating a process for obtaining a conversion value (change amount) of the dielectric constant εrr and the thickness tr for the resonance frequencies fSH and fSL. In FIG. 15, the horizontal axis represents the dielectric constant εrr of the antenna device 10R, and the vertical axis represents the thickness tr of the antenna device 10R.

The change amount acquisition unit 115 selects an arbitrary point P0c on the resonance frequency f0. As an example, it is presumed that the coordinates (εrr, tr) of the point P0c are (3.7, 0.15). The coordinates (εrr, tr) of the point P1c to which the point P0c is moved on the characteristic curve of the resonance frequency fSL with the εrr fixed are (3.7, 0.22). The coordinates (εrr, tr) of the point P1c to which the point P0c is moved on the characteristic curve of the resonance frequency fSL with the tr fixed are (4.2, 0.15).

The change amount acquisition unit 115 acquires 0.22/0.15 as a conversion value (change amount) of the thickness tr from the point P0c to the point P1c. Further, as a conversion value (change amount) of the dielectric constant εrr from the point P0c to the point P2c, 4.2/3.7 is obtained.

Next, the relationship between the points P1c and P2c with respect to the point P0c is obtained for the dielectric constant εr and the thickness tr of the antenna device 10.

Figure 16:
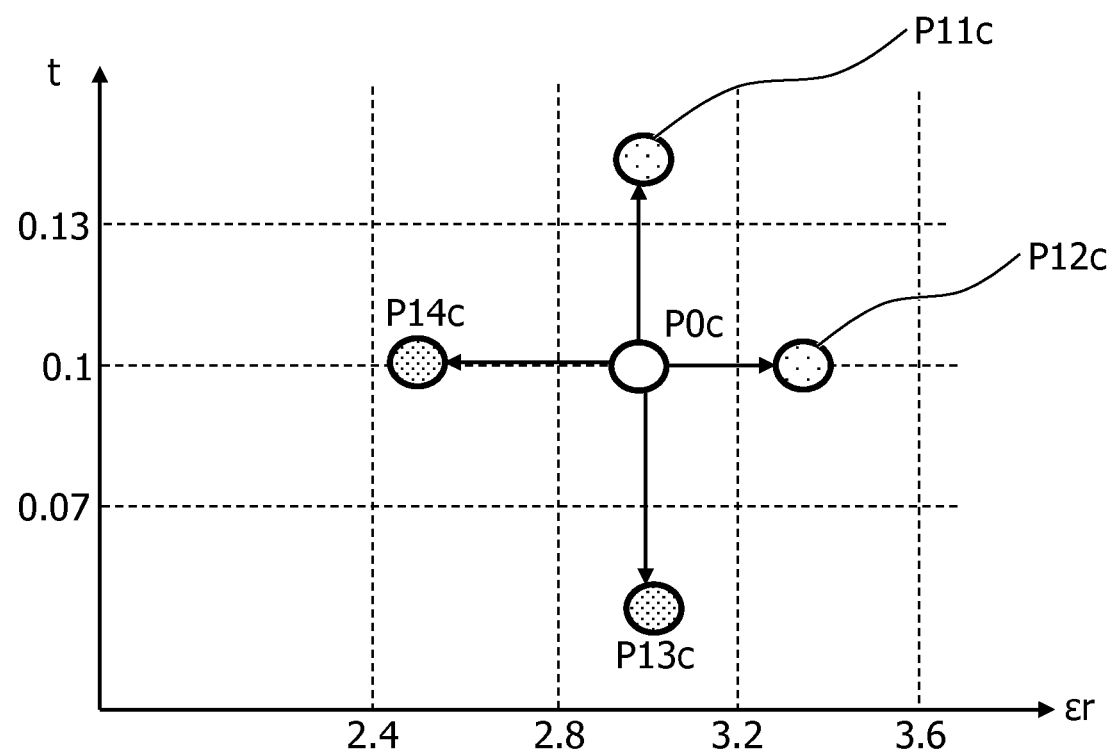
FIG. 16 is a diagram illustrating a process for obtaining a conversion value of the dielectric constant and the thickness for the resonance frequencies.

FIG. 16 is a diagram illustrating a process for obtaining a conversion value of the dielectric constant εrr and the thickness t for the resonance frequencies fSH and fSL. In FIG. 16, the horizontal axis represents the dielectric constant εr of the antenna device 10, and the vertical axis represents the thickness t of the antenna device 10. It is presumed that the dielectric constant εr of the antenna device 10 calculated by the parameter calculation unit 112 is 3, and the thickness tr is 0.1 mm.

By using the coordinates (εr, tr)=(3, 0.1) of a point P10c representing the dielectric constant εr and the thickness tr of the antenna device 10 at the frequency of 2.45 GHz, the coordinates of a point P11c and a point P12c with respect to the point P10c corresponding to the point P1c and the point P2c with respect to the point P0c in FIG. 15.

Since the point P11c with respect to the point P10c is a point on the resonance frequency fSL corresponding to the point P1c with respect to the point P0c in FIG. 15, the value on the horizontal axis of the point P11c is 3. Further, the value on the vertical axis of the point P11c is 0.1×(0.22/0.15)=0.15. For example, the coordinates (εr, tr) of the point P11c are (3, 0.15).

Since the point P12c with respect to point P10c is a point on the resonance frequency fSL corresponding to the point P2c with respect to the point P0c in FIG. 15, the value on the vertical axis of the point P12c is 0.1. Further, the value on the horizontal axis of the point P12c is 3×(4.2/3.7)=3.4. For example, the coordinates (εr, tr) of the point P11c are (3.4, 0.1). Note that the value is rounded off at the second decimal place.

Similar to the relational expression (4) for the height Hm and the length Lm, the relational expression acquisition unit 116 may obtain a straight line passing through the point P11c and the point P12c as a relational expression between the dielectric constant εr and the thickness tr of the antenna device 10 at the resonance frequency fSL.

Similar to the relational expression (5) for the height Hm and the length Lm, the relational expression acquisition unit 116 may obtain a straight line passing through the point P13c and the point P14c as a relational expression between the dielectric constant εr and the thickness tr of the antenna device 10 at the resonance frequency fSH.

Figure 17:
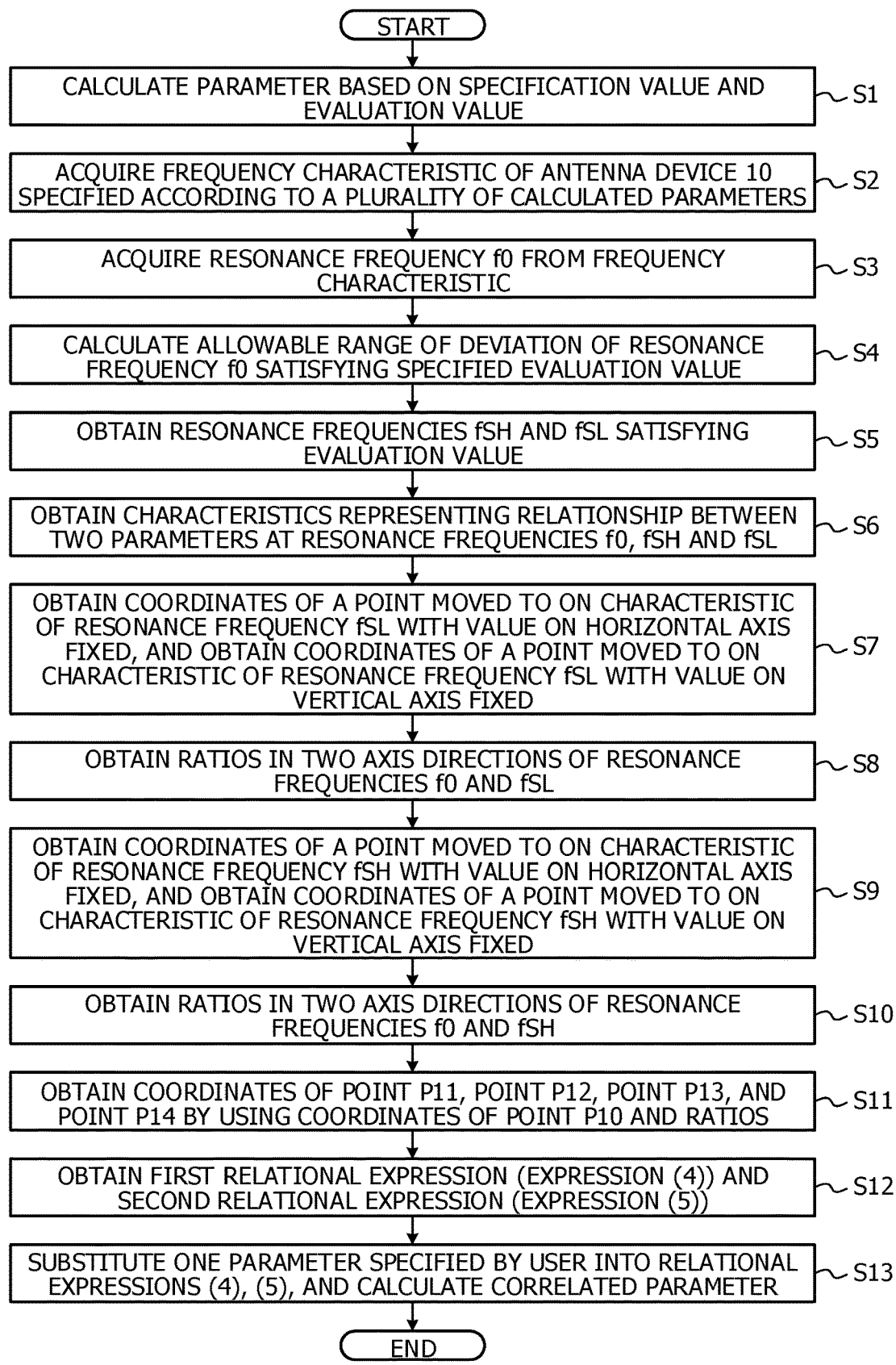
FIG. 17 is a flowchart illustrating a process executed by a control device.

FIG. 17 is a flowchart illustrating a process executed by a control device 110. The process illustrated in FIG. 17 is a process performed by the control device 110 executing the antenna design support program, and a method realized by the control device 110 executing the antenna design support program is an antenna design support method according to the embodiment.

In the following description, in a case of not distinguishing the point P0a, the point P1a, and the point P2a for the height Hr and the length Lr (refer to FIG. 9); the point P0b, the point P1b, and the point P2b for the length GNDxr and the length GNDyr (refer to FIG. 12); and the point P0c, the point P1c, and the point P1c for the dielectric constant εrr and the thickness tr (refer to FIG. 15), the points are referred to as the point P0, the point P1, and the point P2, respectively.

Further, in a case of not distinguishing the point P3a and the point P4a for the height Hr and the length Lr (refer to FIG. 9); the point P3b and the point P4b for the length GNDxr and the length GNDyr (refer to FIG. 12); and the point P3c and the point P4c for the dielectric constant εrr and the thickness tr (refer to FIG. 15), the points are referred to as the point P3 and the point P4, respectively.

In a case of not distinguishing the point P10a, the point P11a, and the point P12a for the height Hm and the length Lm (refer to FIG. 10); the point P10b, the point P11b, and the point P12b for the length GNDx and the length GNDy (refer to FIG. 13); and the point P10c, the point P11c, and the point P12c for the dielectric constant εr and the thickness t (refer to FIG. 16), the points are referred to as the point P10, the point P11, and the point P12.

In a case not distinguishing the point P13a and the point P14a for the height Hm and the length Lm (refer to FIG. 10); the point P13b and the point P14b for the length GNDx and the length GNDy (refer to FIG. 13); and the point P13c and the point P14c for the dielectric constant εr and the thickness t (refer to FIG. 16), the points are referred to as the point P13 and the point P14, respectively.

When the process is started, the parameter calculation unit 112 calculates parameters for determining the structure of the antenna device 10 to be designed based on the specification values and the evaluation values inputted by the user (step S1).

The frequency acquisition unit 113 acquires the frequency characteristics of the antenna device 10 specified by a plurality of parameters calculated by the parameter calculation unit 112 (step S2).

The frequency acquisition unit 113 acquires the resonance frequency f0 of the antenna device 10 from the obtained frequency characteristics (step S3).

The allowable range calculation unit 114 calculates an allowable range of the deviation of the resonance frequency f0 satisfying the specified evaluation value of the antenna device 10 (step S4). The specified evaluation value is a specified value for the evaluation standard selected by the user.

The change amount acquisition unit 115, using the allowable range calculated by the allowable range calculation unit 114, obtains the upper limit resonance frequency fSH satisfying the evaluation value and the lower limit resonance frequency fSL satisfying the evaluation value (step S5).

The change amount acquisition unit 115 reads from the memory 118 and plots characteristics at a plurality of resonance frequencies for two parameters specified by the user, and furthermore, by performing an interpolation process, obtains characteristics representing the relationship between the two parameters at the resonance frequencies f0, fSH, and fSL (step S6). As a result, the characteristics illustrated in FIG. 8 are obtained for the height Hr and the length Lr.

The change amount acquisition unit 115 reads, from the memory 118, a characteristic representing the relationship between two parameters in the antenna device 10R as a reference model for the two parameters specified by the user, and obtains the coordinates of a point on the characteristic curve of the resonance frequency fSL to which an arbitrary point on the resonance frequency f0 is moved with the value on the horizontal axis of the arbitrary point fixed, and obtains the coordinates of a point on the characteristic curve of the resonance frequency fSL to which the arbitrary point on the resonance frequency f0 is moved with the value on the vertical axis of the arbitrary point fixed (step S7).

For example, the change amount acquisition unit 115 selects an arbitrary point P0 on the resonance frequency f0, fixes the value on the horizontal axis of the point P0, and obtains the coordinates of a point P1 on the characteristic curve of the resonance frequency fSL to which the point P0 is moved, and fixes the value on the vertical axis of the point P0, and obtains the coordinates of a point P2 on the characteristic curve of the resonance frequency fSL to which the point P0 is moved.

The change amount acquisition unit 115 obtains the ratio of two axis directions (two axis directions with two parameters as axes) between the resonance frequency f0 acquired by the frequency acquisition unit 113 and the lower limit resonance frequency fSL satisfying the evaluation value for the two parameters in the antenna device 10R (step S8).

The method of determining the ratio is as follows. The change amount acquisition unit 115 obtains the ratio (change amount) of the coordinate values on the vertical axis of the point P0 and the point P1, and obtains the ratio (change amount) of the coordinate values on the horizontal axis of the point P0 and the point P2. The ratio (change amount) of the coordinate values on the vertical axis is a value obtained by dividing the coordinate value on the vertical axis of the point P1 by the coordinate value on the vertical axis of the point P0. The ratio (change amount) of the coordinate values on the horizontal axis is a value obtained by dividing the coordinate value on the horizontal axis of the point P2 by the coordinate value on the horizontal axis of the point P0.

The change amount acquisition unit 115 reads, from the memory 118, a characteristic representing the relationship between two parameters in the antenna device 10R as a reference model for the two parameters specified by the user, and obtains the coordinates of a point on the characteristic curve of the resonance frequency fSH to which an arbitrary point on the resonance frequency f0 is moved with the value on the horizontal axis of the arbitrary point fixed, and obtains the coordinates of a point on the characteristic curve of the resonance frequency fSH to which the arbitrary point on the resonance frequency f0 is moved with the value on the vertical axis of the arbitrary point fixed (step S9).

For example, the change amount acquisition unit 115 selects an arbitrary point P0 on the resonance frequency f0, fixes the value on the horizontal axis of the point P0, and obtains the coordinates of a point P3 on the characteristic curve of the resonance frequency fSH to which the point P0 is moved, and fixes the value on the vertical axis of the point P0, and obtains the coordinates of a point P4 on the characteristic curve of the resonance frequency fSH to which the point P0 is moved.

The change amount acquisition unit 115 obtains the ratio of two axis directions (two axis directions with two parameters as axes) between the resonance frequency f0 acquired by the frequency acquisition unit 113 and the upper limit resonance frequency fSH satisfying the evaluation value for the two parameters in the antenna device 10R (step S10).

The method of determining the ratio is as follows. The change amount acquisition unit 115 obtains the ratio (change amount) of the coordinate values on the vertical axis of the point P0 and the point P3, and obtains the ratio (change amount) of the coordinate values on the horizontal axis of the point P0 and the point P4. The ratio (change amount) of the coordinate values on the vertical axis is a value obtained by dividing the coordinate value on the vertical axis of the point P3 by the coordinate value on the vertical axis of the point P0. The ratio (change amount) of the coordinate values on the horizontal axis is a value obtained by dividing the coordinate value on the horizontal axis of the point P4 by the coordinate value on the horizontal axis of the point P0.

The relational expression acquisition unit 116 obtains coordinates of the point P11, the point P12, the point P13, and the point P14 using the coordinates of the point P10 represented by the values calculated by the parameter calculation unit 112 for the two parameters specified by the user, and the ratio (change amount) obtained in steps S8 and S10 (step S11).

For example, the relational expression acquisition unit 116 calculates the point P11 by multiplying the other of the two parameters (coordinates of the point P10) having correlation with each other of the plurality of parameters calculated by the parameter calculation unit 112 by the ratio of the other parameter of the point P0 and the point P1 obtained from the characteristic representing the relationship between the two parameters in the antenna device 10R as the reference model.

Further, the relational expression acquisition unit 116 calculates the point P12 by multiplying the other of the two parameters (coordinates of the point P10) having correlation with each other of the plurality of parameters calculated by the parameter calculation unit 112 by the ratio of the other parameter of the point P0 and the point P2 obtained from the characteristic representing the relationship between the two parameters in the antenna device 10R as the reference model.

The relational expression acquisition unit 116 calculates the point P13 by multiplying the other of the two parameters (coordinates of the point P10) having correlation with each other of the plurality of parameters calculated by the parameter calculation unit 112 by the ratio of the other parameter of the point P0 and the point P3 obtained from the characteristic representing the relationship between the two parameters in the antenna device 10R as the reference model.

The relational expression acquisition unit 116 calculates the point P14 by multiplying the other of the two parameters (coordinates of the point P10) having correlation with each other of the plurality of parameters calculated by the parameter calculation unit 112 by the ratio of the other parameter of the point P0 and the point P4 obtained from the characteristic representing the relationship between the two parameters in the antenna device 10R as the reference model.

By the process in step S11, the point P11, the point P12, the point P13, and the point P14 illustrated in FIG. 9 are obtained for the height Hr and the length Lr.

The relational expression acquisition unit 116 obtains a first relational expression from the point P11 and the point P12 obtained in the step S11, and obtains a second relational expression from the point P13 and the point P14 obtained in the step S11 (step S12). In a case where the two parameters specified by the user are the height Hm and the length Lm, the first relational expression is the expression (4), and the second relational expression is the expression (5).

The parameter calculation unit 117 substitutes one of the parameters specified by the user into the relational expressions (4) and/or (5) acquired by the relational expression acquisition unit 116, and calculates one other parameter having a correlation with the parameter substituted in the relational expression (step S13).

As a result, for the parameter having a correlation with the one parameter specified by the user at the minimum value fmin and the maximum value fmax of the resonance frequency, it is possible to calculate a value satisfying an evaluation item such as the S11 parameter or the like.

For example, in regard to the two parameters having a correlation with each other, by substituting one value into the expressions (4) or (5), the other value may be easily obtained without separately obtaining the value satisfying the evaluation value. Therefore, the calculation amount may be reduced to half, and the parameters relating to the structure of the antenna may be calculated more quickly.

Therefore, according to this embodiment, it is possible to provide an antenna design support apparatus, an antenna design support program, and an antenna design support method capable of calculating a parameter related to the structure of an antenna at a faster speed.

Figure 18:
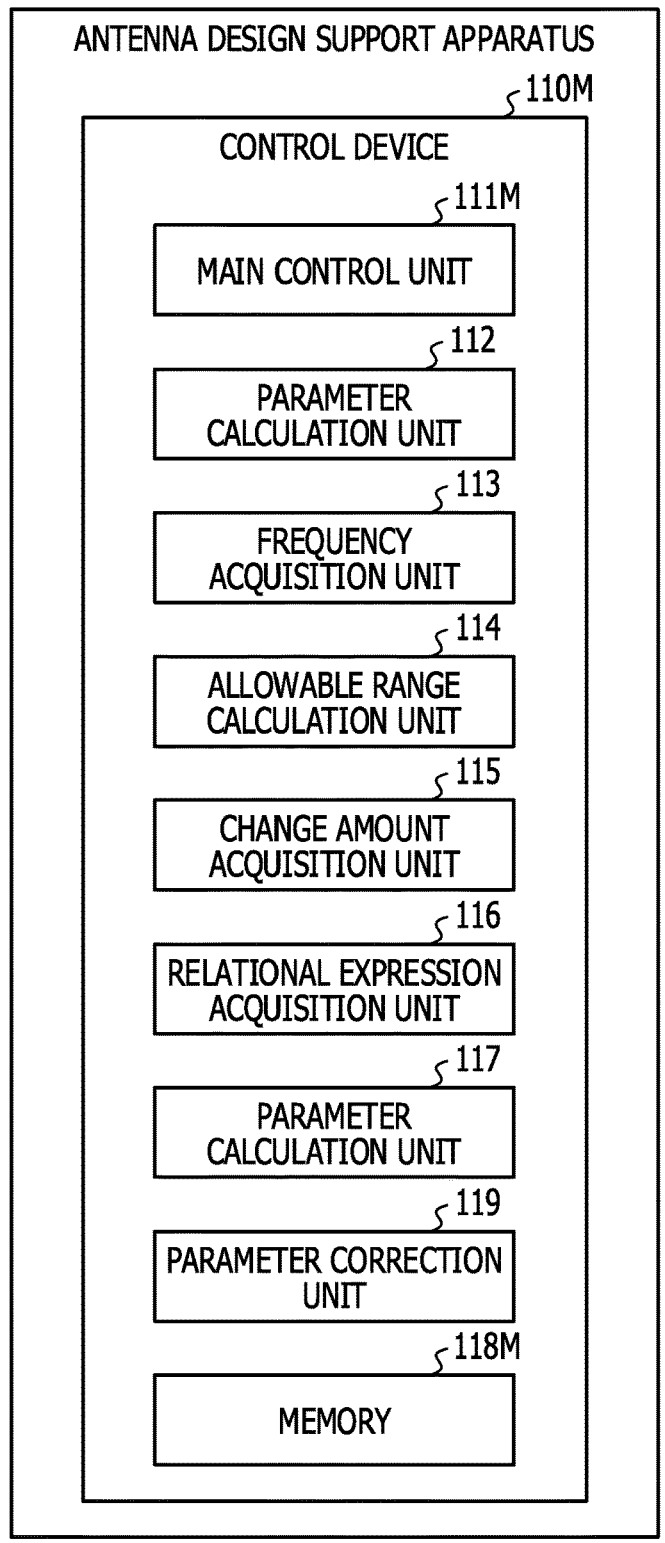
FIG. 18 is a diagram illustrating a functional configuration of a control device of an antenna design support apparatus according to a modification of the embodiment.

Note that a correction function as described below may be added. FIG. 18 is a diagram illustrating a functional configuration of a control device 110M of an antenna design support apparatus 100M according to a modification of the embodiment. The control device 110M includes a main control unit 111M, a parameter calculation unit 112, a frequency acquisition unit 113, an allowable range calculation unit 114, a change amount acquisition unit 115, a relational expression acquisition unit 116, a parameter calculation unit 117, a parameter correction unit 119, and a memory 118M.

The antenna design support apparatus 100M has a configuration in which the control device 110 of the antenna design support apparatus 100 illustrated in FIG. 3 is replaced with the control device 110 M, and the control device 110M has a configuration in which the main control unit 111 and the memory 118 of the control device 110 illustrated in FIG. 3 are replaced with the main control unit 111M and the memory 118M, and a parameter correction unit 119 is further added. The difference is described below.

The main control unit 111M is obtained by adding the following function as a trial calculation unit to the main control unit 111 illustrated in FIG. 3. The trial calculation unit substitutes one of the two parameters having a correlation with each other into a relational expression acquired by the relational expression acquisition unit 116, and calculates the other one. The trial calculation unit performs electromagnetic field simulation of the antenna device 10 using one of the parameters substituted into the relational expression and the other parameter calculated by the relational expression. The trial calculation unit performs a trial calculation of whether or not the specified performance evaluation standard is satisfied by the electromagnetic field simulation.

For example, the trial calculation unit added to the main control unit 111M is a processing unit for determining whether or not the relational expression acquired by the relational expression acquisition unit 116 is able to calculate a parameter satisfying a specified performance evaluation standard.

For example, of the parameters calculated by the parameter calculation unit 112, the trial calculation unit substitutes the height Hm into the expression (4) to obtain the length Lm. The trial calculation unit replaces only the length Lm of the parameters calculated by the parameter calculation unit 112 with the length Lm calculated from the expression (4) to perform the electromagnetic field simulation of the model of the antenna device 10, and performs a trial calculation of whether or not the specified performance evaluation standard is satisfied. In a case where the specified performance evaluation standard is not satisfied, the relational expression acquired by the relational expression acquisition unit 116 may not be able to calculate a parameter satisfying the specified performance evaluation standard.

For example, a case where the relational expression acquired by the relational expression acquisition unit 116 is unable to calculate a parameter satisfying a specified performance evaluation standard is a case, for example, where the lower limit fSL2 of the allowable range obtained based on the simulation model of the antenna device 10 using the parameter obtained by replacing only the length Lm of the parameters calculated by the parameter calculation unit 112 with the length Lm calculated from the expression (4) is lower than the minimum value fmin of the resonance frequency.

Further, of the parameters calculated by the parameter calculation unit 112, the trial calculation unit substitutes the height Hm into the expression (5) and calculates the length Lm. The trial calculation unit replaces only the length Lm of the parameters calculated by the parameter calculation unit 112 with the length Lm calculated from the expression (5) to perform electromagnetic field simulation of the model of the antenna device 10, and performs the trial calculation of whether or not the specified performance evaluation standard is satisfied.

For example, a case where the relational expression acquired by the relational expression acquisition unit 116 is unable to calculate a parameter satisfying a specified performance evaluation standard is a case, for example, where the upper limit fSH2 of the allowable range obtained based on the simulation model of the antenna device 10 using the parameter obtained by replacing only the length Lm of the parameters calculated by the parameter calculation unit 112 with the length Lm calculated from the expression (5) is higher than the maximum value fmax of the resonance frequency.

The memory 118M is different from the memory 118 illustrated in FIG. 3 in that further stores, in addition to the data stored in the memory 118, programs and the data required for the main control unit 111M to function as a trial calculation unit, as the trial calculation unit function is added to the main control unit 111M.

The parameter correction unit 119 performs a correction process on parameters of the plurality of parameters calculated by the parameter calculation unit 117 that are determined by the main control unit 111M functioning as the trial calculation unit not satisfying a specified performance evaluation standard.

The parameter correction unit 119 corrects a parameter not satisfying a specified performance evaluation standard by a ratio between a lower limit resonance frequency fSL2 or an upper limit resonance frequency fSH2 of an allowable range determined by a parameter not satisfying a specified performance evaluation standard, and a lower limit resonance frequency fSL or an upper limit resonance frequency fSH of an allowable range determined by a parameter not satisfying a specified performance evaluation standard (fSL/fSL2 or fSH/fSH2).

As the lower limit resonance frequency fSL or the upper limit resonance frequency fSH of the allowable range determined by the parameter satisfying the specified performance evaluation standard, a value calculated by using the parameter calculated by the parameter calculation unit 112 may be used.

Figure 19:
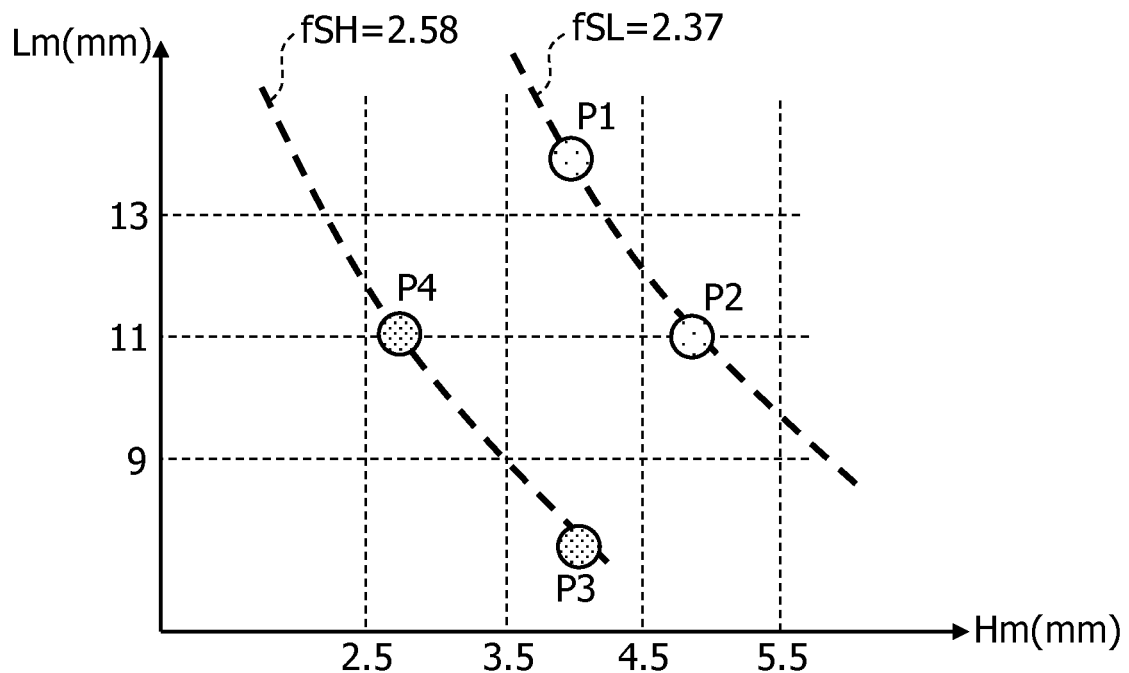
FIG. 19 is a diagram illustrating points before correction.
Figure 20:
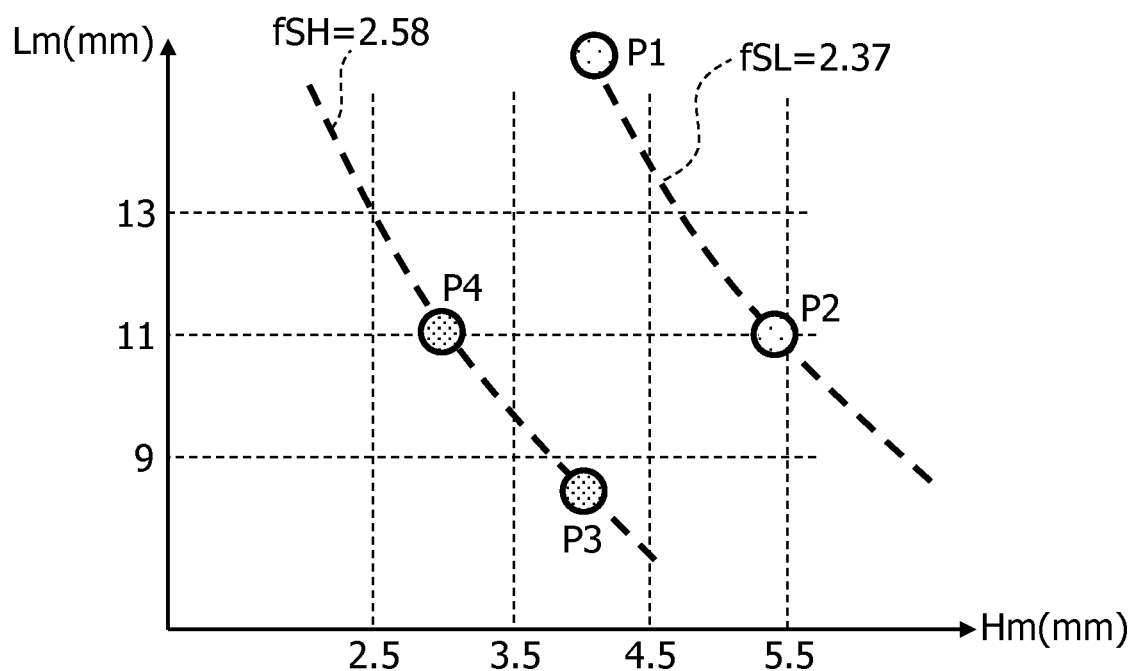
FIG. 20 is a diagram illustrating points after correction.

FIG. 19 is a diagram illustrating points P1 to P4 before correction. FIG. 20 is a diagram illustrating points P1 to P4 after correction. It is presumed that the points P1 to P4 illustrated in FIG. 19 are obtained, two relational expressions are obtained based on points P11 to P14 in which the points P1 to P4 are converted into the coordinate system of the antenna device 10 (refer to FIGS. 10, 13, and 16), and furthermore, the upper limit fSH and the lower limit fSL of the allowable range are also obtained.

In this case, when the lower limit fSL2 of the allowable range determined by the parameter not satisfying the specified performance evaluation standard is lower than the minimum value fmin of the resonance frequency, the parameter not satisfying the specified performance evaluation standard is corrected by the ratio between lower limit resonance frequency fSL2 of the allowable range determined by the parameter not satisfying the specified performance evaluation standard, and the lower limit resonance frequency fSL of the allowable range determined by the parameter satisfying the specified performance evaluation standard (fSL/fSL2).

By performing correction by multiplying the length Lmn of the points P1 and P2 illustrated in FIG. 19 by the ratio (fSL/fSL2), the points P1 and P2 illustrated in FIG. 20 are obtained. As a result, the relational expression acquisition unit 116 may acquire the expression (4) in which the coefficients (the coefficients corresponding to α and β in the expression (3)) are corrected.

When the upper limit fSH2 of the allowable range determined by the parameter not satisfying the specified performance evaluation standard is higher than the maximum value fmax of the resonance frequency, the parameter not satisfying the specified performance evaluation standard is corrected by the ratio between upper limit resonance frequency fSH2 of the allowable range determined by the parameter not satisfying the specified performance evaluation standard, and the upper limit resonance frequency fSH of the allowable range determined by the parameter satisfying the specified performance evaluation standard (fSH/fSH2).

By performing correction by multiplying the length Lm of the points P3 and P4 illustrated in FIG. 19 by the ratio (fSH/fSH2), the points P3 and P4 illustrated in FIG. 20 are obtained. As a result, the relational expression acquisition unit 116 may acquire the expression (5) in which the coefficients (the coefficients corresponding to α and β in the expression (3)) are corrected.

In this manner, when there is a parameter determined not satisfying the specified performance evaluation standard, the coordinates of the points P1 to P4 may be corrected by multiplying by the ratio between the resonance frequency fSH2, fSL2 and resonance frequency fSH, fSL (fSH/fSH2 or fSL/fSL2), and highly precise relational expressions (4) and (5) may be obtained based on the coordinates of the corrected points P1 to P4.

The antenna design support apparatus, the antenna design support program, and the antenna design support method according to the exemplary embodiments have been described above, however, the embodiments are not limited to the specifically disclosed embodiments, and various modifications and changes are possible without departing from the scope of the claims.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An antenna design support apparatus comprising:
a memory; and
circuitry coupled to the memory and configured to:
calculate a plurality of first parameters for determining a structure of a first antenna device based on a specification value set for the first antenna device to be a target of performance evaluation;
acquire a communication frequency based on the plurality of first parameters;
calculate an allowable range of deviation of the communication frequency satisfying a specified performance evaluation standard of the first antenna device;
determine a structure of a second antenna device as a reference model, and obtain a change amount corresponding to change in the communication frequency in the allowable range of two second parameters having a correlation with each other;
acquire a relational expression of two first parameters of the plurality of first parameters, the two first parameter corresponding to the second parameter and having a correlation with each other; and
obtain a first change amount of one of the two second parameters and a second change amount of another one of the two second parameters as the change amount when the communication frequency is moved to an upper limit of the allowable range.

2. The antenna design support apparatus according to claim 1, wherein the circuitry substitutes one of the two first parameters having the correlation with each other into the relational expression, and calculates another one of the two first parameters.

3. The antenna design support apparatus according to claim 1, wherein the circuitry:
uses one of the two first parameters that is substituted into the relational expression, and another one of the two first parameters that is calculated from the relational expression to perform trial calculation to determine whether or not the first antenna device satisfies the specified performance evaluation standard; and when it is determined that the specified performance evaluation standard is not satisfied, corrects the one of the two first parameters that is substituted into the relational expression and another one of the two first parameters that is calculated from the relational expression by a ratio between a lower limit or an upper limit of a communication frequency of the allowable range set by the two first parameters used in the trial calculation, and a lower limit or an upper limit of a communication frequency of the allowable range calculated by an allowable range calculation unit.

4. The antenna design support apparatus according to claim 1, wherein the circuitry:
acquires an expression satisfying a first value obtained by multiplying one of the two first parameters having the correlation with each other by the first change amount, a first coordinate point specified by another one of the two first parameters having the correlation with each other, a second value obtained by multiplying the other of the two first parameters having the correlation with each other by the second change amount; and a second coordinate point specified by one of the two first parameters having the correlation with each other as a first relational expression of the relational expression.

5. The antenna design support apparatus according to claim 4, wherein the first relational expression is a linear expression.

6. The antenna design support apparatus according to claim 1, wherein the circuitry:
obtains a third change amount of one of the two second parameters and a fourth change amount of another one of the two second parameters as the change amount when the communication frequency is moved to a lower limit of the allowable range; and
acquires an expression satisfying a third value obtained by multiplying one of the two first parameters having a correlation with each other by the third change amount, a third coordinate point specified by another one of the two first parameters having a correlation with each other, a fourth value obtained by multiplying another one of the two first parameters having a correlation with each other by the fourth change amount; and a fourth coordinate point specified by one of the two first parameters having a correlation with each other as a second relational expression of the relational expression.

7. The antenna design support apparatus according to claim 6, wherein the second relational expression is a linear expression.

8. A non-transitory computer-readable storage medium storing a program that causes a processor included in an antenna design apparatus to execute a process, the process comprising:

calculate a plurality of first parameters for determining a structure of a first antenna device based on a specification value set for the first antenna device to be a target of performance evaluation;
acquire a communication frequency based on the plurality of first parameters;
calculate an allowable range of deviation of the communication frequency satisfying a specified performance evaluation standard of the first antenna device;
determine a structure of a second antenna device as a reference model, and obtain a change amount corresponding to change in the communication frequency in the allowable range of two second parameters having a correlation with each other;
acquire a relational expression of two first parameters of the plurality of first parameters based on the two first parameters and the change amount, the two first parameter corresponding to the second parameter and having a correlation with each other; and
obtain a first change amount of one of the two second parameters and a second change amount of another one of the two second parameters as the change amount when the communication frequency is moved to an upper limit of the allowable range.

9. An antenna design support method, comprising:
calculate a plurality of first parameters for determining a structure of a first antenna device based on a specification value set for the first antenna device to be a target of performance evaluation;
acquire a communication frequency based on the plurality of first parameters;
calculate an allowable range of deviation of the communication frequency satisfying a specified performance evaluation standard of the first antenna device;
determine a structure of a second antenna device as a reference model, and obtain a change amount corresponding to change in the communication frequency in the allowable range of two second parameters having a correlation with each other;
acquiring a relational expression of two first parameters of the plurality of first parameters based on the two first parameters and the change amount, the two first parameter corresponding to the second parameter and having correlation with each other; and
obtaining a first change amount of one of the two second parameters and a second change amount of another one of the two second parameters as the change amount when the communication frequency is moved to an upper limit of the allowable range.

* * * * *